(12) United States Patent
Matsuda et al.

(10) Patent No.: US 6,225,019 B1
(45) Date of Patent: May 1, 2001

(54) PHOTOSENSITIVE RESIN, RESIST BASED ON THE PHOTOSENSITIVE RESIN, EXPOSURE APPARATUS AND EXPOSURE METHOD USING THE RESIST, AND SEMICONDUCTOR DEVICE OBTAINED BY THE EXPOSURE METHOD

(75) Inventors: Minoru Matsuda, Sendai; Hiroshi Maehara, Yokohama; Keita Sakai, Utsunomiya, all of (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/244,162

(22) Filed: Feb. 4, 1999

(30) Foreign Application Priority Data

Feb. 5, 1998 (JP) .................................. 10-024367
Feb. 2, 1999 (JP) .................................. 11-024969

(51) Int. Cl.[7] ........................... G03F 7/004; C08G 75/20; C08F 283/00
(52) U.S. Cl. ........................... 430/270.1; 430/5; 430/296; 430/311; 430/324; 430/325; 525/536; 528/382; 528/364; 528/373; 528/376
(58) Field of Search ..................................... 528/382, 376, 528/373; 430/270.1, 296, 325, 5, 320, 324, 311; 525/536

(56) References Cited

U.S. PATENT DOCUMENTS

| | | | |
|---|---|---|---|
| 3,313,785 | 4/1967 | Zutty | 260/79.3 |
| 3,898,350 | 8/1975 | Gipstein et al. | 427/43 |
| 4,262,073 * | 4/1981 | Pampalone et al. | 430/18 |
| 4,397,938 * | 8/1983 | Desai et al. | 430/296 |
| 4,540,719 * | 9/1985 | Loomis | 521/89 |
| 4,751,168 * | 6/1988 | Tsuchiya et al. | 430/272 |
| 5,298,367 | 3/1994 | Hoessel, et al. | 430/326 |
| 6,004,720 * | 12/1999 | Takechi et al. | 430/270.1 |

FOREIGN PATENT DOCUMENTS

| | | |
|---|---|---|
| 3416131 | 11/1984 | (DE) . |
| 0505757 | 9/1992 | (EP) . |
| 080515 | 4/1993 | (JP) . |
| 265212 | 10/1993 | (JP) . |

OTHER PUBLICATIONS

Database WP1, Section Ch, Wk 9540, Derwent, AN95–304400, XP 0021103031 for JP 07–199467.

* cited by examiner

Primary Examiner—Cynthia Hamilton
Assistant Examiner—Rosemary Ashton
(74) Attorney, Agent, or Firm—Fitzpatrick, Cella, Harper & Scinto

(57) ABSTRACT

Provided is a photosensitive resin with high sensitivity to exposure light. The photosensitive resin comprises a vinyl monomer moiety having an alicyclic group in a side chain thereof, and a sulfonyl moiety.

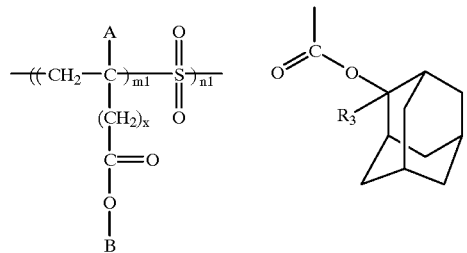

B is an alicyclic group,

28 Claims, 9 Drawing Sheets

PHOTOSENSITIVE RESIN, RESIST BASED ON THE PHOTOSENSITIVE RESIN, EXPOSURE APPARATUS AND EXPOSURE METHOD USING THE RESIST, AND SEMICONDUCTOR DEVICE OBTAINED BY THE EXPOSURE METHOD

BACKGROUND OF THE INVENTION

1. Field of the Invention

The present invention relates to a photosensitive resin having the performance of high sensitivity and high resolution, a photoresist based on the photosensitive resin, a pattern formed using the resist, a pattern forming method, a device (semiconductor device) or a mask for exposure fabricated by the pattern forming method.

2. Related Background Art

In recent years, microfabrication is advancing in semiconductor elements including integrated circuits, display elements, and so on, or in masks for exposure or the like, so that pattern linewidths tend to be decreased. Exposure light used for the microfabrication is light in the near ultraviolet to ultraviolet region, and the processing is carried out in the wavelength region of these light beams (600 to 300 nm). The decrease of linewidths, however, is now approaching the limit, and for further decrease of linewidth, using light of shorter wavelengths as the exposure light is attempted. The photolithography technology using the ArF excimer laser of the wavelength 193 nm or the KrF excimer laser of the wavelength 248 nm as an exposure light source is under development in recent years.

With this tendency toward the shorter wavelengths of the exposure light, required properties of resists are high transmittance to the exposure light and high resolution. Japanese Patent Application Laid-Open Nos. 5-80515 and 5-265212 disclose resists. Japanese Patent Application Laid-Open No. 5-80515 discloses a resist comprised of a copolymer of 2-substituted 2-norbornene and acrylate. There is, however, some concern over toxicity, because the 2-substituted 2-norbornene disclosed in the application has the cyano group (CN). The reason why the copolymer can undergo alkali development is that its side chains are subject to hydroxylation. Therefore, it has low solubility in alkali solution. Japanese Patent Application Laid-Open No. 5-265212 discloses the resist comprised of a copolymer having the adamantane skeleton in side chains. The copolymer disclosed in this application, however, also has low solubility in alkali solution in alkali development, because it is a high molecular weight compound.

SUMMARY OF THE INVENTION

Therefore, the present invention provides a photosensitive resin comprising a vinyl monomer moiety having an alicyclic group in a side chain thereof, and a sulfonyl moiety.

The present invention also provides a method of producing a semiconductor device, the method comprising the step of coating a substrate with a resist comprising a photosensitive resin, the photosensitive resin comprising a vinyl monomer moiety having an alicyclic group in a side chain thereof, and a sulfonyl moiety, and the step of exposing the resist coated on the substrate to form a pattern.

The present invention also provides a method of producing a mask for exposure, the method comprising the step of coating a substrate with a resist comprising a photosensitive resin, the photosensitive resin comprising a vinyl monomer moiety having an alicyclic group in a side chain thereof, and a sulfonyl moiety, and the step of exposing the resist coated on the substrate to form a pattern.

The present invention also provides a semiconductor device having a pattern formed with a resist comprising a photosensitive resin, the photosensitive resin comprising a vinyl monomer moiety having an alicyclic group in a side chain thereof, and a sulfonyl moiety.

The present invention also provides a mask for exposure having a pattern formed with a resist comprising a photosensitive resin, the photosensitive resin comprising a vinyl monomer moiety having an alicyclic group in a side chain thereof, and a sulfonyl moiety.

The present invention also provides a photosensitive resin comprising a vinyl monomer moiety having an adamantyl group in a side chain thereof, and a sulfonyl moiety.

The present invention also provides a resist having dissolved therein a photosensitive resin comprising a vinyl monomer moiety having an adamantyl group in a side chain thereof, and a sulfonyl moiety.

The present invention also provides a method of producing a semiconductor device, the method comprising the step of coating a substrate with a resist comprising a photosensitive resin, the photosensitive resin comprising a vinyl monomer moiety having an adamantyl group in a side chain thereof, and a sulfonyl moiety, and the step of exposing the resist coated on the substrate to form a pattern.

The present invention also provides a method of producing a mask for exposure, the method comprising the step of coating a substrate with a resist comprising a photosensitive resin, the photosensitive resin comprising a vinyl monomer moiety having an adamantyl group in a side chain thereof, and a sulfonyl moiety, and the step of exposing the resist coated on the substrate to form a pattern.

The present invention also provides a semiconductor device having a pattern formed with a resist comprising a photosensitive resin, the photosensitive resin comprising a vinyl monomer moiety having an adamantyl group in a side chain thereof, and a sulfonyl moiety.

The present invention also provides a mask for exposure having a pattern formed with a resist comprising a photosensitive resin, the photosensitive resin comprising a vinyl monomer moiety having an adamantyl group in a side chain thereof, and a sulfonyl moiety.

The present invention also provides an exposure method of exposing a resist by images of patterns of a mask having a plurality of patterns whose images have mutually different contrasts, using the resist comprising the photosensitive resin as set forth above, wherein an image forming position of a pattern with a low contrast out of the images of the patterns of the mask is exposed by an image with a higher contrast than that of the image of the pattern with the low contrast, thereby enhancing contrast of an exposure dose distribution concerning the pattern with the low contrast.

The present invention also provides an exposure method of exposing a resist by an image of a pattern of a mask with radiation, using the resist comprising the photosensitive resin as set forth above, wherein an image with a higher contrast than that of the image of the pattern is formed with radiation having the same wavelength as that of the aforementioned radiation and an image forming position of the pattern of the resist is exposed by the image with the higher contrast, thereby enhancing contrast of an exposure dose distribution concerning the pattern of the resist.

The present invention also provides an exposure method of exposing a resist by an image of a pattern of a mask, using the resist comprising the photosensitive resin as set forth above, wherein an image with a higher contrast than that of the image of the pattern is formed without using the mask and an image forming position of the pattern of the resist is exposed by the image with the higher contrast, thereby enhancing a contrast of an exposure dose distribution concerning the pattern of the resist.

The present invention also provides an exposure method of exposing a resist, using a resist comprising the photosensitive resin as set forth above, wherein double exposures are carried out at the same exposure wavelength by a periodic pattern exposure for carrying out exposure by a periodic pattern formed by interference of two beams or the like, and a normal exposure for carrying out normal exposure using a mask having a pattern of a linewidth not more than a resolving power of an exposure apparatus.

According to the present invention, the photosensitive resin of the present invention can decrease its molecular weight, because the bonds are easily cleaved between the vinyl monomer moiety and the sulfonyl moiety during exposure. The photosensitive resin of the present invention drastically increases its solubility in the alkali solution because of the decrease of molecular weight thereof. The resist prepared using the photosensitive resin of the present invention thus has high sensitivity to the exposure light and can form a highly accurate pattern. Further, because the solubility of exposed regions into the developer is high, the pattern can be developed in a short time.

Since the photosensitive resin of the present invention has the alicyclic group in its side chain, it has high transmittance to the exposure light and good dry-etch resistance. As a consequence, it is possible to obtain a semiconductor device or a mask for exposure having a fine pattern.

DETAILED DESCRIPTION OF THE PREFERRED EMBODIMENTS

First Embodiment

Figure 1:
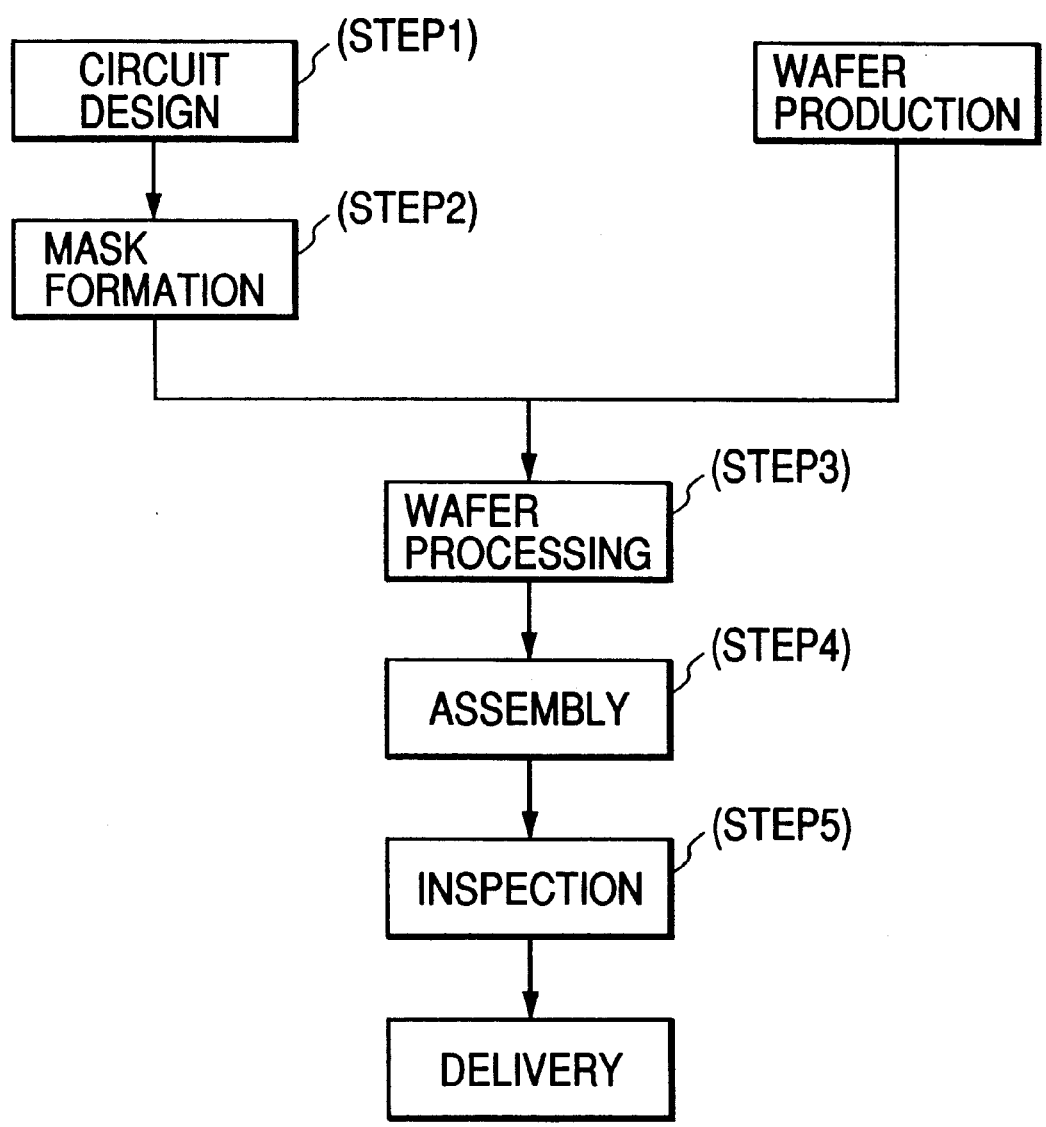
FIG. 1 is a flowchart of a method of producing a semiconductor device according to the present invention.

The photosensitive resin of the first embodiment of the present invention is a photosensitive resin having the main chain skeleton comprised of a vinyl monomer moiety having the carbon skeleton having an alicyclic group B in a side chain, and a sulfonyl moiety, as shown in Formula 1.

[Formula 1]

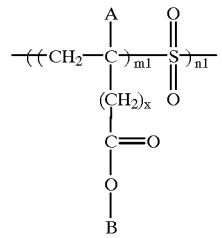

In Formula 1, X is an integer which is desirably either one selected from 1 to 6, A is either one of hydrogen (H), methyl ($CH_3$), and halogen, B is the alicyclic group which may be monocyclic or more preferably polycyclic, and m1 and n1 each indicate an integer.

Specific examples of the carbon skeleton constituting the alicyclic group are listed below as shown by (a) to (af) of Formula 2, and it should be noted that the present invention is by no means intended to be limited to these. It is also noted that the alicyclic groups B of the respective vinyl monomer moieties present in the number of m1 do not always have to be identical.

[Formula 2]

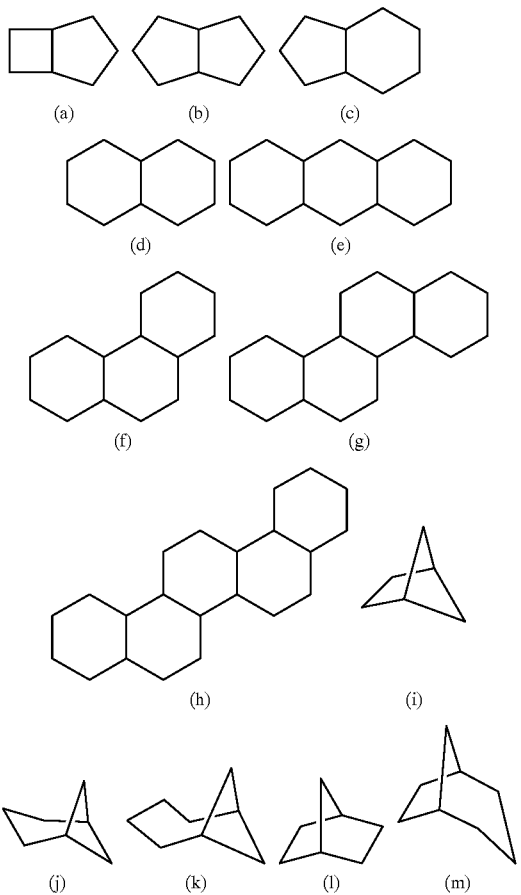

-continued

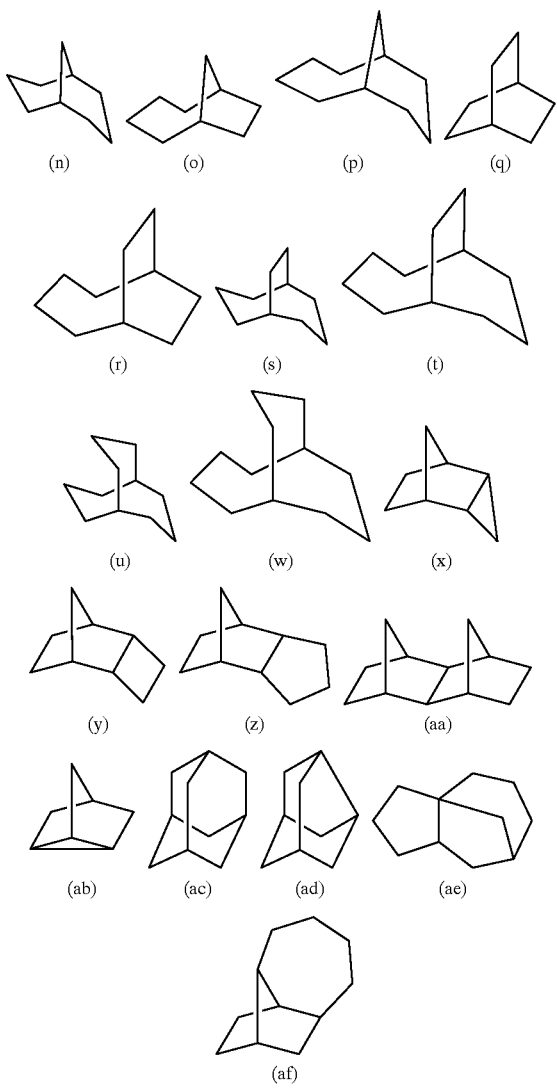

(n) (o) (p) (q) (r) (s) (t) (u) (w) (x) (y) (z) (aa) (ab) (ac) (ad) (ae) (af)

The photosensitive resin of the present invention is a copolymer that can be obtained by copolymerization of the above-stated vinyl monomer and sulfur dioxide for providing the sulfonyl moiety. The weight average molecular weight of the copolymer obtained can be changed by adjusting an amount of an initiator in synthesis of the copolymer, the temperature of polymerization, or a charge amount of each monomer. The weight average molecular weight of the copolymer obtained is of the order of several hundreds to several millions and more preferably of the order of several ten thousands to several millions.

The exposure light for exposing the photosensitive resin of the present invention can be ultraviolet light including far-ultraviolet light and vacuum ultraviolet light. More specifically, preferred exposure light can be one selected from the $F_2$ excimer laser, the XeCl excimer laser, the KrF excimer laser, the ArF excimer laser, and so on. Moreover, the preferred exposure light can also be selected from electromagnetic waves including X-rays, charged particles such as electron beams, ion beams, or the like, and so on. The photosensitive resin of the present invention turns into low molecular weight compounds as the bonds (scission sites) are cleaved between the vinyl monomer moiety and the sulfonyl moiety constituting the main chain by the exposure light. The photosensitive resin having turned into the low molecular weight compounds drastically increases its solubility, for example, into isoamyl methyl ketone or into a mixed solvent of isoamyl methyl ketone and 2-pentanone, as compared with the solubility of the high molecular weight compound before the exposure.

In the photosensitive resin of the present invention, the number of scission sites in the main chain can be controlled by adjusting a charge amount of sulfur dioxide in synthesis. Therefore, the solubility of the low molecular weight compounds after the exposure can be controlled preliminarily on the occasion of synthesis.

The vinyl monomer and sulfur dioxide used in the present invention are easy to copolymerize, which means that they are easy to copolymerize because electron states of the respective monomers are in the host-guest relation. More specifically, the C of the methylene group side chain is bound directly to the C of the vinyl monomer to be bound to S of sulfur dioxide. By making use of this property, the copolymer of the present invention can also be an alternating copolymer. Since the alternating copolymer obtained in the present invention has a lot of scission sites, described above, in the main chain, it has a high sensitivity to exposure and a very high solubility after the exposure.

The photosensitive resin of the present invention does not have any unsaturated bonds of an aromatic ring or the like. Therefore, the photosensitive resin of the present invention has high transparency to the i-line of the mercury lamp, the XeCl excimer laser, the KrF excimer laser, and the ArF excimer laser as the exposure light. The photosensitive resin of the present invention also has good transparency to electromagnetic waves such as the X-rays or the like, and charged particles such as the electron beams, the ion beams, or the like.

The photosensitive resin of the present invention can not be only of the structure of the vinyl monomer moiety and sulfonyl moiety, but may also be preferably a ternary copolymer indicated by Formula 3, obtained by adding another monomer as a regulator. Specifically, the preferred ternary copolymer is one obtained using the regulator selected from vinyl-ester-based monomers as indicated by Formula 5. In the vinyl-ester-based monomer moiety indicated by Formula 5, $R_1$ represents hydrogen (H), methyl ($CH_3$), or halogen, and $R_2$ represents hydrogen (H) or an alkyl group. The alkyl group is preferably one whose carbon number is either one of 1 to 8. In the structures, y, m2, and n2 are integers.

[Formula 3]

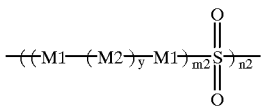

In Formula 3, M1 is a structural unit represented by the following formula.

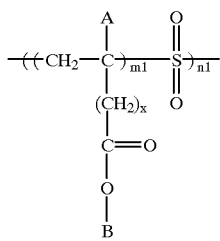

[Formula 4]

In Formula 4, X is an integer, which is desirably either one of 1 to 6, A is either one of hydrogen (H), methyl (CH$_3$), and halogen, B is an alicyclic group, and the alicyclic group may be monocyclic or more preferably polycyclic. In Formula 4, m1, n1 are integers.

In Formula 3, M2 is a structural unit represented by the following formula.

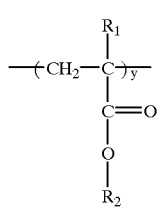

[Formula 5]

In Formula 5, R$_1$ indicates either one of hydrogen (H), methyl (CH$_3$), and halogen, R$_2$ represents hydrogen (H) or alkyl, and the alkyl group is desirably one whose carbon number is either one of 1 to 8. In Formula 5, y is an integer.

When the photosensitive resin of the present invention is the ternary copolymer as described above, it varies the solubility in the solvent, the coating characteristics onto the substrate, or functions such as the sensitivity to exposure, heat resistance, and so on.

Incidentally, in the photosensitive resin of the present invention, the alicyclic group may directly be bounded to the methylene group of the side chain bounded to the carbon of the main chain. Further, the functional group —CO—O— intervening between the methylene group and the alicyclic group in Formula 1 may be any other functional group of alternative equivalency.

Second Embodiment

The second embodiment of the present invention is a resist prepared using the photosensitive resin described in the first embodiment. The resist is comprised of a solution in which the photosensitive resin described in the first embodiment is dissolved in a solvent. A concentration of the photosensitive resin in the resist is preferably adjusted based on a desired thickness where it is applied onto the substrate. Specifically, the weight percentage of the photosensitive resin is 1 wt % to 50 wt % and desirably 3 wt % to 30 wt % approximately.

The solvent used in the present invention can be one selected, for example, from alkoxy ethanols such as methyl cellosolve, ethyl cellosolve, butyl cellosolve, and the like, acetates of the aforementioned alkoxy ethanols such as methyl cellosolve acetate, ethyl cellosolve acetate, butyl cellosolve acetate, and the like, propylene glycol acetates such as propylene glycol monomethyl ether acetate and the like, lactate esters such as ethyl lactate and the like, aliphatic ketones such as methyl ethyl ketone, 2-pentanone, methyl isobutyl ketone, methyl isoamyl ketone, and the like, alicyclic ketones such as cyclohexanone, N-methylpyrrolidone, and the like, aromatic compounds such as benzene, toluene, xylene, chlorobenzene, and the like, and so on. One of these solvents may be used alone or some of them may be used in a mixed state. In order to control the solubility into these solvents and the vapor pressure, these solvents may be mixed with one selected from alcohols such as methyl alcohol, ethyl alcohol, n-propyl alcohol, isopropyl alcohol, and the like, aliphatic hydrocarbons such as pentane, hexane, heptane, octane, and the like, alicyclic compounds such as cyclopentanone, cyclohexane, and the like, and so on.

A variety of materials for regulating the performance of the resist may be added to the resist of the present invention. For example, in order to control the coating characteristics onto the substrate, an anionic, cationic, amphoteric, or non-polar surface active agent, or a fluorine based surface active agent, or the like may be added to the resist. Further, for the purpose of enhancing the storage stability of the resist, the resist may include an additive selected from monophenol type compounds such as phenol, cresol, methoxyphenol, 2, 6-di-t-butyl-p-cresol, and so on, bisphenol type compounds such as 2, 2' methylenebis (4-methyl-6-t-butylphenol) and the like, polymer phenol type compounds such as 1, 1, 3-tris (2-methyl-4-hydroxy-5-t-butylphenyl) butane and the like, sulfur base antioxidants such as dilauryl-3, 3'-thiodipropionate and the like, phosphorus base antioxidants such as triphenyl phosphite and the like, and antioxidants such as sorbic acid, erythorbic acid, isopropyl citrate, nordihydroguaiaretic acid, and so on.

Since the resist of the present invention comprises the photosensitive resin of the present invention, it has the high sensitivity and the high transmittance to the exposure light beams described in the first embodiment of the present invention. Therefore, the resist of the present invention is adaptable to the decrease of the depth of focus occurring as the numerical aperture NA of the optical system of light projection exposure apparatus increases.

In the resist of the present invention, for example, another type of resin for enhancing dry-etch resistance may be blended with the photosensitive resin of the present invention. Examples of such another type of resin used in the present invention include novolak resin represented by (1) of Formula 6 and alkali-soluble resin such as polyvinyl phenol or the like represented by (2) of Formula 6. Other examples of the alkali-soluble resin include those having an alicyclic group, such as polyglutaraldehyde, cellulose derivatives, and so on.

The kind of the above-stated alkali-soluble resin is determined preferably according to the type of the electromagnetic wave or the charged particles used for the exposure.

Specifically, when the exposure light is ultraviolet light, electromagnetic waves such as X-rays or the like, or charged particles such as electron beam, ion beam, or the like, the above-stated alkali-soluble resin can be preferably blended in the resist of the present invention.

When the exposure light is the KrF excimer laser, it is preferable to blend the alkali-soluble resin such as polyvinyl phenol, polyglutaraldehyde, the cellulose derivatives, and so on in the resist of the present invention.

When the exposure light is the ArF excimer laser, it is preferable to blend the alkali-soluble resin having the alicyclic group, such as polyglutaraldehyde, the cellulose derivatives, and so on in the resist of the present invention.

[Formula 6]

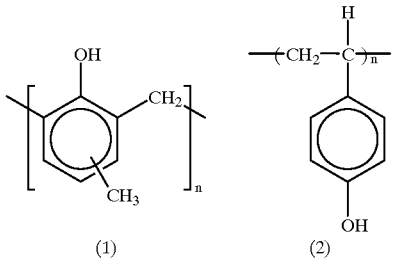

(1)  (2)

In addition to the novolak resin (1) and polyvinyl phenol (2), other examples of the resin to be blended in the resist of the present invention are alkali-soluble silicon-containing polymers. The alkali-soluble silicon-containing polymers used in the present invention are, for example, ladder type siloxane polymers represented by Formula 7.

[Formula 7]

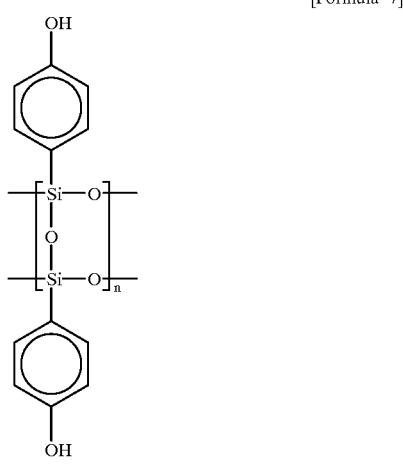

As described above, the resist of the present invention can be used in the form of a multilayered resist when combined with the silicon-containing polymer.

As described above, the resist of the present invention can be obtained using the copolymer of the present invention alone, one using the combination thereof with the alkali-soluble resin, or one used in the form of the multilayered resist, particularly, when combined with the silicon-containing polymer among the alkali-soluble polymers.

Third Embodiment

The photosensitive resin of the third embodiment of the present invention is a photosensitive resin which has the main chain skeleton comprised of a vinyl monomer moiety having an alicyclic group in a side chain, and a sulfonyl moiety, as represented by Formula 8.

[Formula 8]

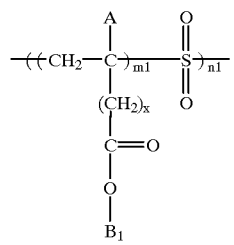

In Formula 8, X is an integer, which is desirably either one of 1 to 6, A is either one of hydrogen (H), methyl ($CH_3$), and halogen, and $B_1$ is a functional group comprising an alicyclic group.

A characteristic point of the present embodiment, when compared with the first embodiment, is that the functional group comprising the alicyclic group reacts in the presence of an acid to enhance the solubility in the alkali developer.

Specific examples of the functional group comprising the alicyclic group in the present embodiment are listed below as (a) to (e) of Formula 9, but it is noted that the present invention is by no means intended to be limited to these. It is also noted that the alicyclic groups B of the respective vinyl monomers present in the number of m1 do not always have to be identical. Further, the —$CH_3$ group of the alicyclic group (a) in Formula 9 may be substituted with —$C_2H_5$ or —$C_3H_7$ group.

[Formula 9]

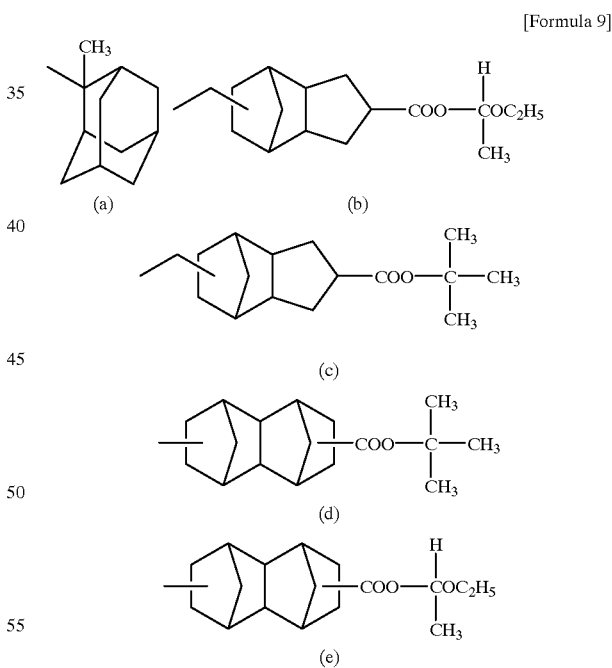

The photosensitive resin of the present invention is a copolymer that can be obtained by copolymerization of the above-stated vinyl monomer and sulfur dioxide for providing the sulfonyl moiety. The weight average molecular weight of the copolymer obtained was able to be changed by adjusting an amount of an initiator in synthesis of the copolymer, the temperature of polymerization, or a charge amount of each monomer. The weight average molecular weight of the copolymer obtained is of the order of several hundreds to several millions and more preferably of the order of several ten thousands to several millions.

The exposure light for exposing the photosensitive resin of the present invention can be ultraviolet light including far-ultraviolet light and vacuum ultraviolet light. More specifically, preferred exposure light can be one selected from the $F_2$ excimer laser, the XeCl excimer laser, the KrF excimer laser, the ArF excimer laser, and so on. Moreover, the preferred exposure light can also be selected from electromagnetic waves including x-rays, charged particles such as electron beams, ion beams, or the like, and so on. The photosensitive resin of the present invention turns into low molecular weight compounds as the bonds (scission sites) are cleaved between the vinyl monomer moiety and the sulfonyl moiety constituting the main chain by the exposure light. The photosensitive resin having turned into the low molecular weight compounds drastically increases the solubility into the alkali solution, as compared with the solubility of the high molecular weight substance before the exposure.

In the photosensitive resin of the present invention, the number of scission sites in the main chain can be controlled by adjusting a charge amount of sulfur dioxide in synthesis. Therefore, the solubility of the low molecular weight compounds after the exposure can be controlled preliminarily on the occasion of synthesis.

The vinyl monomer and sulfur dioxide used in the present invention are easy to copolymerize, which means that they are easy to copolymerize because electron states of the respective monomers are in the host-guest relation. By making use of this property, the copolymer of the present invention can also be an alternating copolymer. Since the alternating copolymer obtained in the present invention has a lot of scission sites, described above, in the main chain, it has a high sensitivity to exposure and a very high solubility after the exposure.

The photosensitive resin of the present invention does not have any unsaturated bonds of an aromatic ring or the like. Therefore, the photosensitive resin of the present invention has high transparency to the i-line of the mercury lamp, the XeCl excimer laser, the KrF excimer laser, the ArF excimer laser, electromagnetic waves such as the X-rays or the like, charged particles such as electron beams, ion beams, and so on as the exposure light.

The photosensitive resin of the present invention can not be only of the structure of the vinyl monomer moiety and sulfonyl moiety, but may also be preferably a ternary copolymer indicated by Formula 10, obtained by adding another monomer as a regulator. Specifically, the preferred ternary copolymer is one obtained using the regulator selected from vinyl-ester-based monomers as indicated by Formula 12. In the vinyl-ester-based monomer moiety indicated by Formula 12, $R_1$ represents hydrogen (H), methyl ($CH_3$), or halogen, and $R_2$ represents hydrogen (H) or an alkyl group. The alkyl group is preferably one whose carbon number is either one of 1 to 8.

[Formula 10]

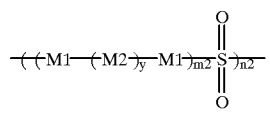

In Formula 10, M1 is a structural unit represented by the following formula, and y, m2, n2 are integers.

[Formula 11]

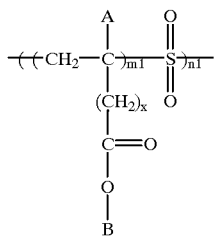

In Formula 11, X is an integer, which is desirably either one of 1 to 6, A is either one of hydrogen (H), methyl ($CH_3$), and halogen, and B is a functional group.

In Formula 10, M2 is a structural unit represented by the following formula.

[Formula 12]

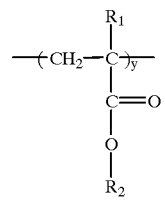

In Formula 12, $R_1$ indicates either one of hydrogen (H), methyl ($CH_3$), and halogen, $R_2$ represents hydrogen (H) or alkyl, and the alkyl group is desirably one whose carbon number is either one of 1 to 8.

When the photosensitive resin of the present invention is the ternary copolymer as described above, it varies the solubility in the solvent, the coating characteristics onto the substrate, or the functions such as the sensitivity to exposure, heat resistance, and so on.

Fourth Embodiment

The fourth embodiment of the present invention is a resist prepared using the photosensitive resin described in the third embodiment. The resist is comprised of a solution in which the photosensitive resin described in the third embodiment is dissolved in a solvent. A concentration of the photosensitive resin in the resist is preferably adjusted based on a desired thickness where it is applied onto the substrate. Specifically, the weight percentage of the photosensitive resin is 1 wt % to 50 wt % and desirably 3 wt % to 30 wt % approximately.

The solvent used in the present invention can be one selected, for example, from alkoxy ethanols such as methyl cellosolve, ethyl cellosolve, butyl cellosolve, and the like, acetates of the aforementioned alkoxy ethanols such as methyl cellosolve acetate, ethyl cellosolve acetate, butyl cellosolve acetate, and the like, propylene glycol acetates such as propylene glycol monomethyl ether acetate and the like, lactate esters such as ethyl lactate and the like, aliphatic ketones such as methyl ethyl ketone, 2-pentanone, methyl isobutyl ketone, methyl isoamyl ketone, and the like, alicyclic ketones such as cyclohexanone, N-methylpyrrolidone, and the like, aromatic compounds such as benzene, toluene, xylene, chlorobenzene, and the like, and so on. One of these solvents may be used alone or some of them may be used in a mixed state. In order to control the solubility into these solvents and the vapor pressure, these solvents may be mixed with alcohols such as methyl alcohol, ethyl alcohol, n-propyl alcohol, isopropyl alcohol, and the like, aliphatic hydrocarbons such as pentane, hexane, heptane, octane, and the like, alicyclic compounds such as cyclopentanone, cyclohexane, and the like, and so on.

A variety of materials for regulating the performance of the resist may be added to the resist of the present invention. For example, in order to control the coating characteristics onto the substrate, an anionic, cationic, amphoteric, or non-polar surface active agent, or a fluorine based surface active agent, or the like may be added to the resist. Further, for the purpose of enhancing the storage stability of the resist, the resist may include an additive selected from monophenol type compounds such as phenol, cresol, methoxyphenol, 2, 6-di-t-butyl-p-cresol, and so on, bisphenol type compounds such as 2, 2' methylenebis (4-methyl-6-t-butylphenol) and the like, polymer phenol type compounds such as 1, 1, 3-tris (2-methyl-4-hydroxy-5-t-butylphenyl) butane and the like, sulfur base antioxidants such as dilauryl-3, 3'-thiodipropionate and the like, phosphorus based antioxidants such as triphenyl phosphite and the like, and antioxidants such as sorbic acid, erythorbic acid, isopropyl citrate, nordihydroguaiaretic acid, and so on.

Since the resist of the present invention comprises the photosensitive resin of the present invention, it has the high sensitivity and high transmittance to the exposure light beams described in the third embodiment of the present invention.

The resist of the present invention has the high solubility in the alkali developer after the exposure, whereby the time for development can be decreased.

The resist of the present invention can be used in the form of a chemically amplified resist when used in combination with a photo-acid generator. The photosensitive resin contained in the resist of the present invention has the functional group which reacts in the presence of an acid to enhance the solubility in the alkali developer, in the side cain of the vinyl monomer moiety. The functional group reacts under the acid evolving from the photo-acid generator during the exposure, so that the photosensitive resin of the present invention is made soluble in the alkali solution.

The photo-acid generator generates the acid with electromagnetic waves charged particles, or the like. The photo-acid generator suitably used in the present invention is one selected, for example, from sulfonium salts such as triphenyl sulfonium trifluoromethane sulfonate represented by (3) of Formula 13, and the like, iodonium salts such as diphenyl iodonium hexafluoroantimonate represented by (4) of Formula 13, and the like, and so on. A photo-acid generator may be used alone or a plurality of photo-acid generators may be used in combination. The added amount of the photo-acid generator used in the present invention by weight percentage is 0.1 wt % to 20 wt % and preferably 1 wt % to 10 wt % approximately.

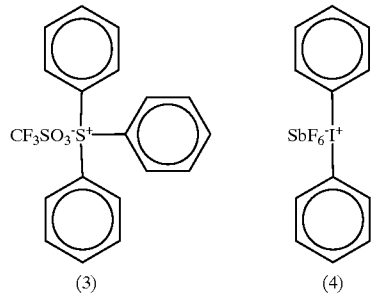

[Formula 13]

In the resist of the present invention, for example, another type of resin for enhancing dry-etch resistance may be blended with the photosensitive resin of the present invention. Examples of such another type of resin used in the present invention include novolak resin represented by (5) of Formula 14 and alkali-soluble resin such as polyvinyl phenol or the like represented by (6) of Formula 14. Other examples of the alkali-soluble resin include those having an alicyclic group, such as polyglutaraldehyde, cellulose derivatives, and so on.

The kind of the above-stated alkali-soluble resin is determined preferably according to the type of the electromagnetic wave or the charged particles used for the exposure.

Specifically, when the exposure light is ultraviolet light, electromagnetic waves such as X-rays or the like, or charged particles such as electron beam, ion beam, or the like, the above-stated alkali-soluble resin can be preferably blended in the resist of the present invention.

When the exposure light is the KrF excimer laser, it is preferable to blend the alkali-soluble resin such as polyvinyl phenol, polyglutaraldehyde, the cellulose derivatives, and so on in the resist of the present invention.

When the exposure light is the ArF excimer laser, it is preferable to blend the alkali-soluble resin having the alicyclic group, such as polyglutaraldehyde, the cellulose derivatives, and so on in the resist of the present invention.

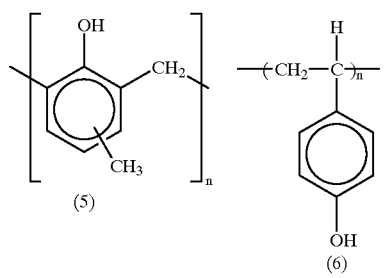

[Formula 14]

In addition to the novolak resin (5) and polyvinyl phenol (6), other examples of the resin to be blended in the resist of the present invention are alkali-soluble silicon-containing polymers. The alkali-soluble silicon-containing polymers used in the present invention are, for example, ladder type siloxane polymers represented by Formula 15.

[Formula 15]

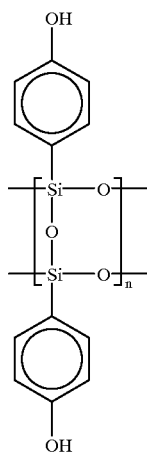

As described above, the resist of the present invention can be used in the form of a multilayered resist when combined with the silicon-containing polymer.

As described above, the resist of the present invention can be one obtained using the copolymer of the present invention alone, can be one used in the form of the chemically amplified resist when combined with the photo-acid generator, can be one used in combination with the alkali-soluble resin, or can be one used in the form of the multilayered resist, particularly, when used in combination with the silicon-containing polymer among the alkali-soluble polymers. The photo-acid generator and at least one of the alkali-soluble polymers can be used together with the resist of the present invention or at least two of the alkali-soluble polymers may be used as being added to the resist of the present invention.

Fifth Embodiment

Described as the fifth embodiment is a pattern formed by use of the resist of the present invention. The forming step of the pattern is generally composed of an application step of applying the resist onto a substrate and the step of forming the pattern by exposure of the applied resist. Spin coating is mainly employed for the application step and it is preferable that the resist uniformly spread within a short period during the spin coating. The resist of the present invention uniformly spreads in short time during the spin coating and also uniformly spreads in a small thickness on the substrate. Therefore, the resist of the present invention can be preferably used with the light of short wavelengths such as the ArF, KrF excimer lasers and the like, in the exposure step. In the exposure step, the exposure light is guided onto the resist through a mask in which a pattern image is formed. At this time, the exposure is carried out particularly preferably by the step-and-repeat method for successively moving positions of the resist to be exposed. Then the exposed resist portions are removed by a developer, thereby obtaining the pattern.

The resist of the present invention has the high sensitivity, high resolution, and excellent depth of focus when the exposure light is either one of electromagnetic waves such as the X-rays, KrF excimer laser, ArF excimer laser, and so on, or charged particles such as electron beam, ion beam, and so on. The pattern obtained using the resist of the present invention is formed well by use of either exposure light.

The pattern obtained at this time has the focus latitude of 0.8 μm in the case of the 0.25 μm line-and-space pattern and the focus latitude of 0.5 μm in the case of the 0.18 μm line-and-space pattern.

The maximum aspect ratio of the pattern obtained using the resist of the present invention can be 7.

The material for the substrate coated with the resist of the present invention may be either an insulating material, an electroconductive material, or a semiconductor material.

Specific examples of insulating materials applicable herein include silicon-based materials such as silicon oxide, PSG, BPSG, silicon nitride, and the like, oxide materials such as aluminum oxide and the like, organic insulating materials such as polyimide, polyamide, and the like, and so on. The resist of the present invention can be applied onto either one of the insulating materials.

Specific examples of electroconductive materials applicable herein include metals such as copper, aluminum, tungsten, chromium, titanium, iron, and the like, alloys containing at least one of the foregoing metals, organic conductive materials, and so on. The resist of the present invention can also be applied onto either one of the conductive materials.

Specific examples of semiconductor materials applicable herein include silicon, gallium arsenide, and so on and the resist of the present invention can also be applied onto either one of the semiconductor materials.

The resist of the present invention can also be applied well onto optical components of silica, fluorite, quartz, or the like.

The formation of the pattern using the resist of the present invention permits fabrication of semiconductor devices such as IC, LSI, CCD, photoelectric conversion devices, and so on, substrates for display, masks for exposure, and so on.

Sixth Embodiment

Figure 3:
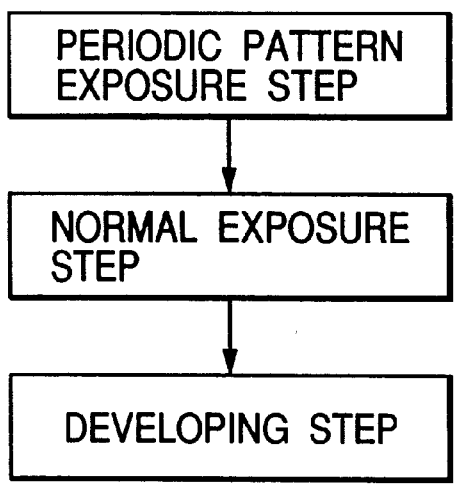
FIG. 3 is a flowchart for explaining an example of an exposure method using the resist of the present invention.

FIG. 3 is a flowchart to show an embodiment of the exposure method where the pattern is formed using the resist comprising the photosensitive resin of the present invention. FIG. 3 shows blocks of a periodic pattern exposure step of carrying out exposure by an image with a high contrast, a normal exposure step (projection exposure step) using a circuit pattern image which demonstrates a low contrast in the conventional method, and a development step of developing the resist after the double exposures, constituting the exposure method of the present embodiment, and the flow of the blocks. The order of the periodic pattern exposure step and the normal exposure step may be reversed from that of FIG. 3, or they may be carried out simultaneously. When either one of the steps includes a plurality of exposure stages (double or more exposures), the steps may also be carried out alternately. In this case the total exposure operation is triple or more exposures. Although there are other steps including the step of carrying out precise position alignment between the exposure steps, they are omitted from the illustration herein. The periodic pattern exposure step is effected, for example, by two-beam interference exposure.

Figure 4A:
FIG. 4A and FIG. 4B are explanatory diagrams to show a periodic pattern (exposure pattern) obtained by two-beam interference exposure.
Figure 4B:
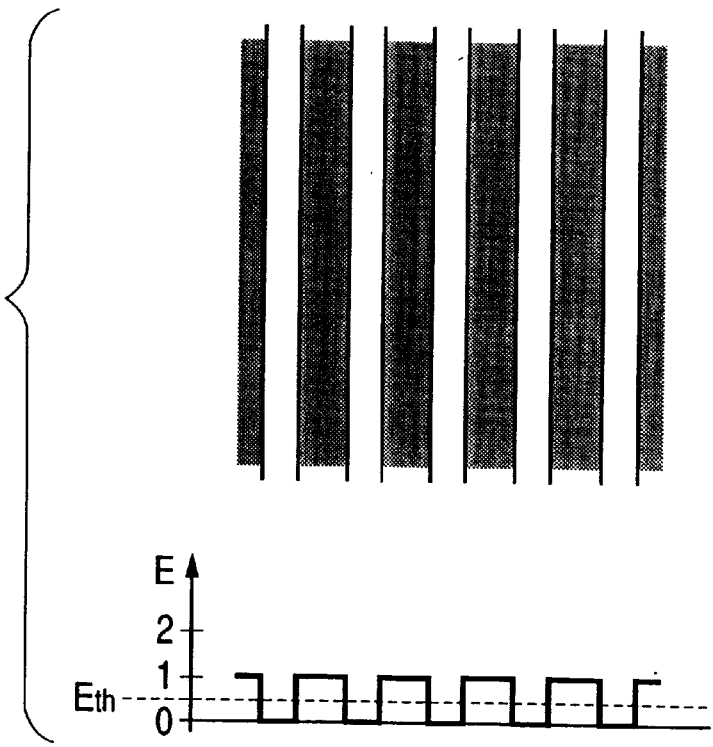

When the exposure is carried out according to the flow of FIG. 3, the wafer (photosensitive substrate) is first exposed in the periodic pattern (image) as illustrated in FIGS. 4A and 4B, by the periodic pattern exposure. Numerals in FIGS. 4A and 4B indicate exposure doses, and FIG. 4A shows the mask pattern or the image thereof, in which hatched portions are exposed at the exposure dose 1 (which is arbitrary in practice) and blank portions at the exposure dose 0.

In the case where only this periodic pattern is exposed and is developed thereafter, it is normal practice to set an exposure threshold Eth (a boundary value at which the thickness of the resist after the development becomes 0) of the resist of the photosensitive substrate (wafer) between the exposure doses 0 and 1 as illustrated in the graph in the lower part of FIG. 4B. The upper part of FIG. 4B shows the lithography pattern (projected and depressed pattern) obtained finally.

Figure 5:
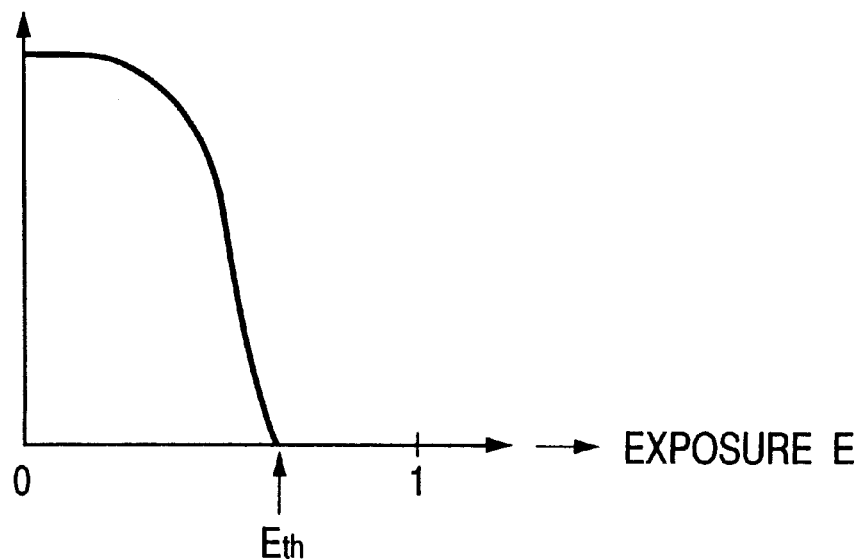
FIG. 5 is an explanatory diagram to show exposure sensitivity characteristics of the resist.

FIG. 5 shows exposure (exposure dose) dependence of thickness after the developing (development), and the exposure threshold as to the resist comprising the photosensitive resin of the present invention in the photosensitive substrate in the case of FIGS. 4A and 4B. In the case of the present embodiment, the thickness after the development is 0 when the exposure dose is not less than the exposure threshold.

Figure 6:
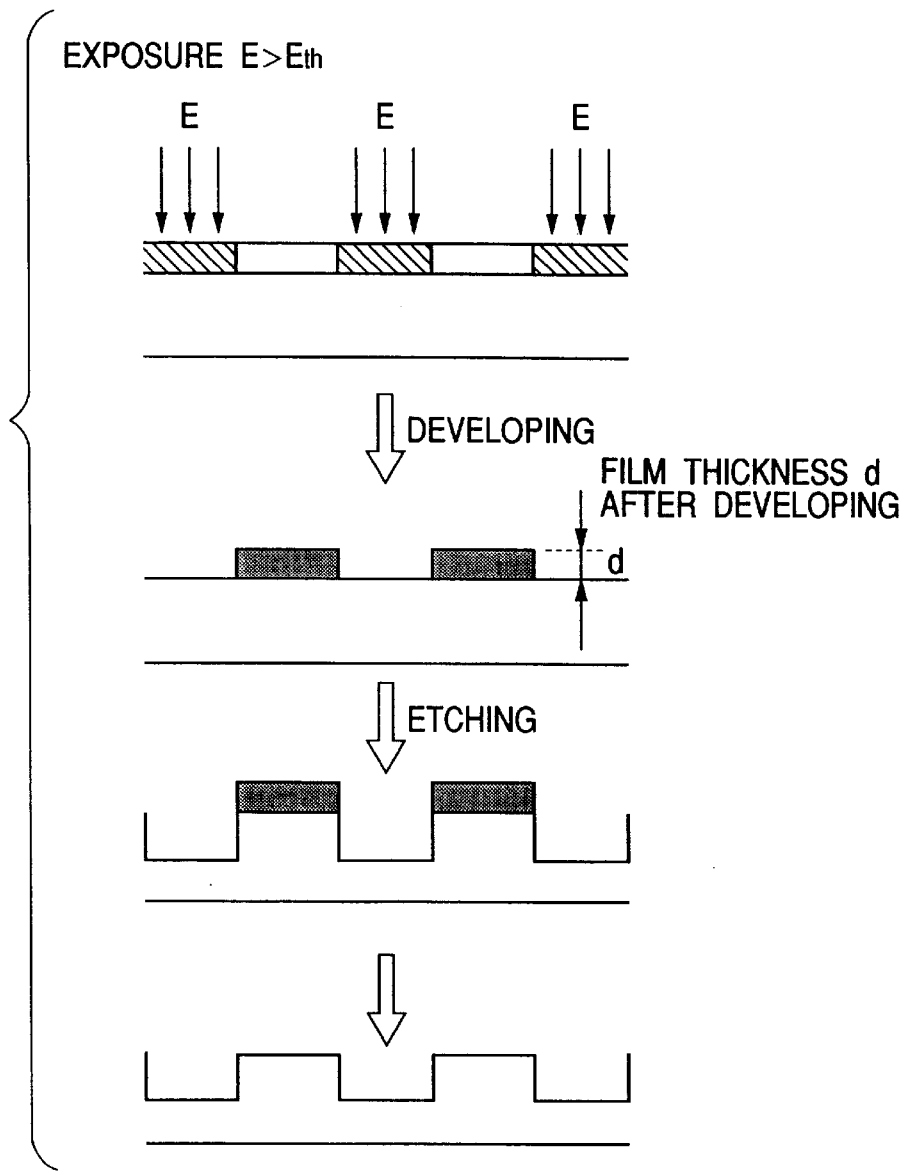
FIG. 6 is an explanatory diagram to show pattern formation by developing (development)

FIG. 6 is a schematic diagram to show how the lithography pattern is formed through the development and etching process where the above exposure is carried out. In the present embodiment the photolithography pattern or the exposure pattern hereinafter means a pattern composed of portions where the resist thickness is 0 because of the exposure over the exposure threshold Eth and portions where the resist remains because of the exposure not more than Eth.

Figure 7:
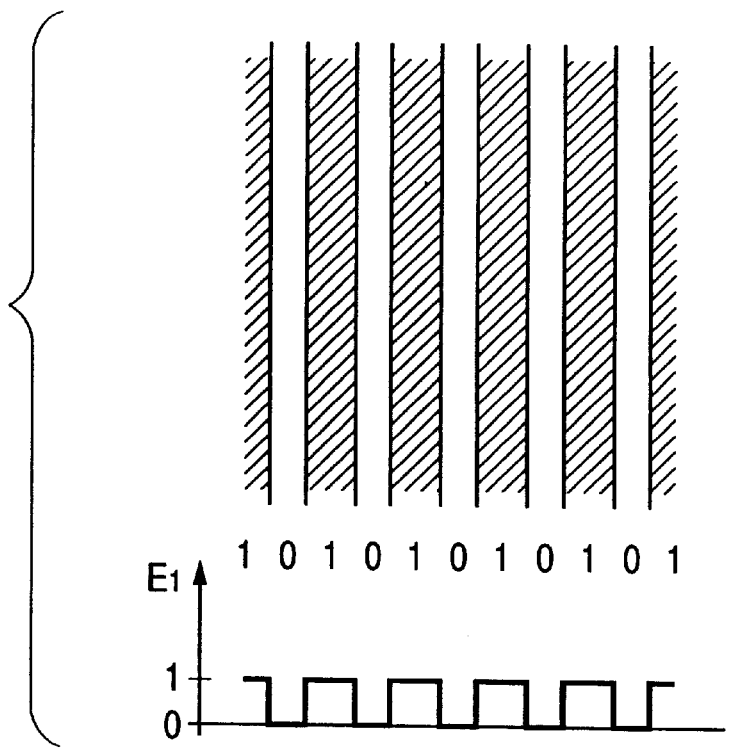
FIG. 7 is an explanatory drawing to show a periodic pattern (exposure pattern) by normal two-beam interference exposure.
Figure 8:
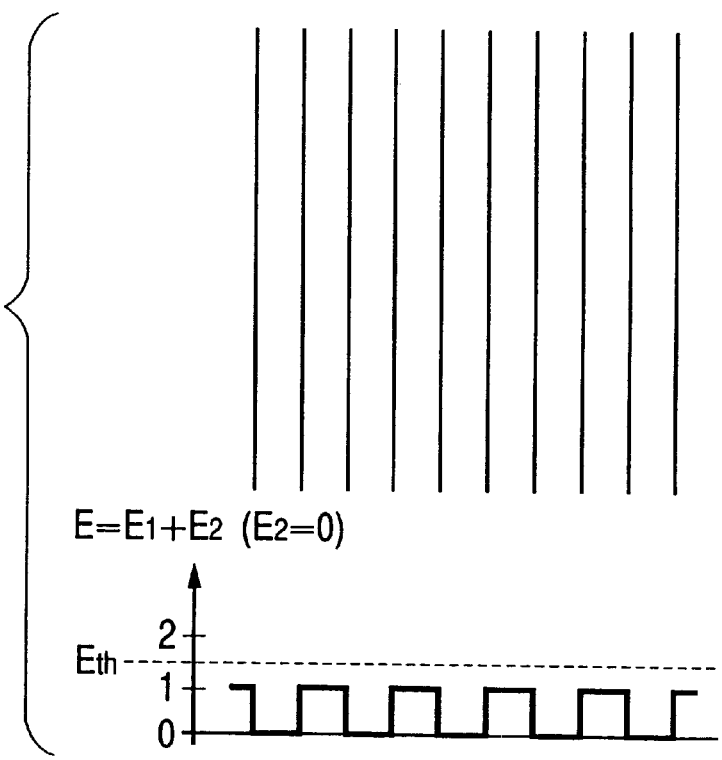
FIG. 8 is an explanatory diagram to show a periodic pattern (exposure pattern) by two-beam interference exposure.

In the present embodiment, supposing the maximum exposure dose in the periodic pattern exposure (two-beam interference exposure) to provide the image with the high contrast is 1, the threshold value Eth of the resist of the photosensitive substrate is set to be larger than 1, as illustrated in FIG. 7 (which is the same figure as FIG. 4A) and FIG. 8, different from the normal exposure sensitivity setting of FIGS. 4A, 4B to FIG. 6. When this photosensitive substrate is subjected to only the periodic pattern exposure illustrated in FIGS. 4A and 4B and the exposure pattern (exposure dose distribution) of the resist thereof is developed, the exposure dose is insufficient and there appears no portion having the thickness of 0 after the development, though there are some thickness variations. Therefore, the so-called lithography pattern of projections and depressions is not formed by etching. This can be regarded as disappearance of the periodic pattern. In FIG. 8, the upper part shows the lithography pattern (in which there is nothing formed though there are a plurality of thin lines drawn) and the graph of the lower part shows the relation between the exposure dose distribution and the exposure threshold Eth in the resist. In the lower part, $E_1$ represents the exposure dose in the periodic pattern exposure used in the double exposures and $E_2$ the exposure dose in the normal exposure used in the double exposures.

The feature of the present embodiment is that the double exposures (or triple or more exposures) achieve fusion of the exposure pattern by the periodic pattern image of high resolution, which seems to disappear with only the periodic pattern exposure, with the exposure pattern by the circuit pattern image of an arbitrary shape including the pattern (image) of the size not more than the resolving power of exposure apparatus by the normal exposure, to selectively expose only desired areas at the exposure dose not less than the exposure threshold Eth of the resist, thereby finally forming the desired lithography pattern.

Figure 9A:
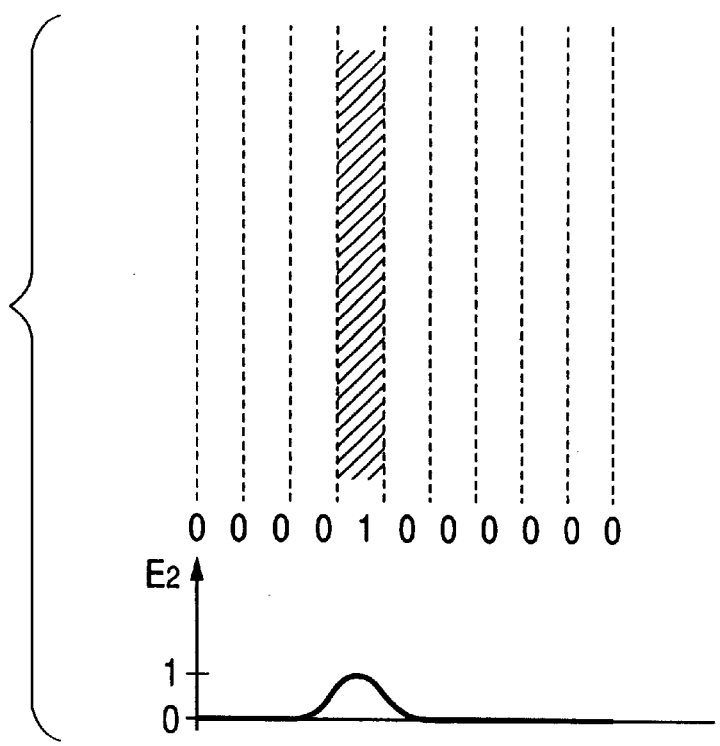
FIG. 9A and FIG. 9B are explanatory diagrams to show an example of the exposure pattern (lithography pattern) which can be formed in the sixth embodiment.

FIG. 9A shows the exposure pattern by the normal exposure, in which a microscopic circuit pattern below the resolving power of projection exposure apparatus cannot be resolved and the intensity distribution of the pattern image on the exposed object or the exposure dose distribution of the resist by this pattern image spreads in a blurred manner.

The mask pattern forming the exposure pattern of FIG. 9A is a microscopic pattern having a linewidth equal to approximately half of the linewidth that can be resolved by the normal projection exposure (which can achieve the desired contrast).

Figure 9B:
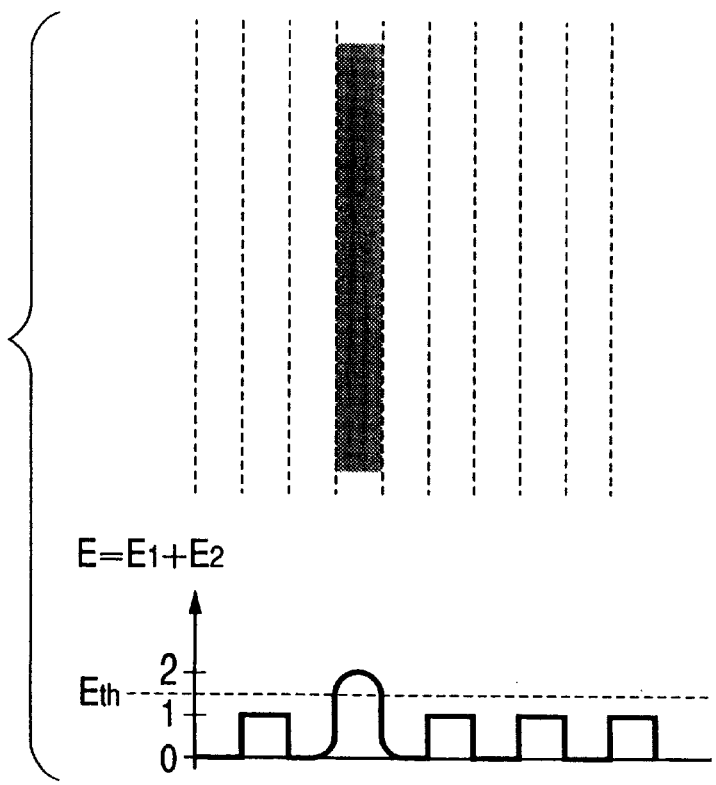

Supposing that after the periodic pattern exposure of FIG. 7 and without carrying out the development step, the projection exposure to form the exposure pattern of FIG. 9A is carried out as superimposed in the same region or at the same exposure position of the same resist, the total exposure dose distribution of this resist is as shown in the graph in the lower part of FIG. 9B. Since the ratio of the exposure dose $E_1$ of the periodic pattern exposure to the exposure dose $E_2$ of the projection exposure is 1:1 and the exposure threshold Eth of the resist is set between the exposure dose $E_1$ (=1) of the periodic pattern exposure and the sum (=2) of the exposure dose $E_1$ and the exposure dose $E_2$ (=1) of the exposure of the normal circuit pattern, the lithography pattern shown in the upper part of FIG. 9B is formed. On that occasion the center of the exposure pattern of the normal exposure is aligned with the peak of the exposure pattern of the periodic pattern exposure and the isolated line pattern shown in the upper part of FIG. 9B has the resolution equivalent to that of the periodic pattern exposure and does not include the simple periodic pattern. Therefore, the pattern is obtained in the high resolution over the resolution that can be implemented by the normal projection exposure.

Figure 10A:
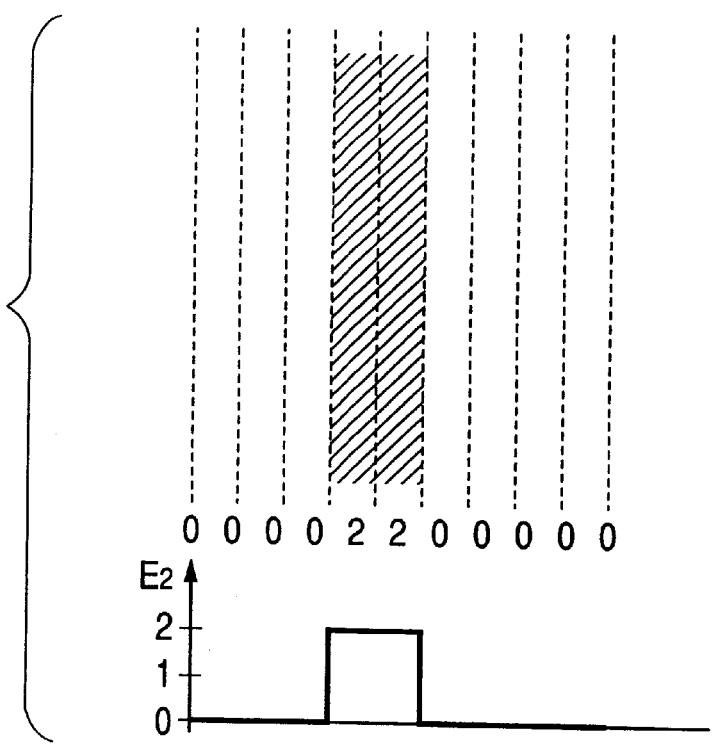
FIG. 10A and FIG. 10B are explanatory diagrams to show another example of the exposure pattern (lithography pattern) which can be formed in the sixth embodiment.
Figure 10B:
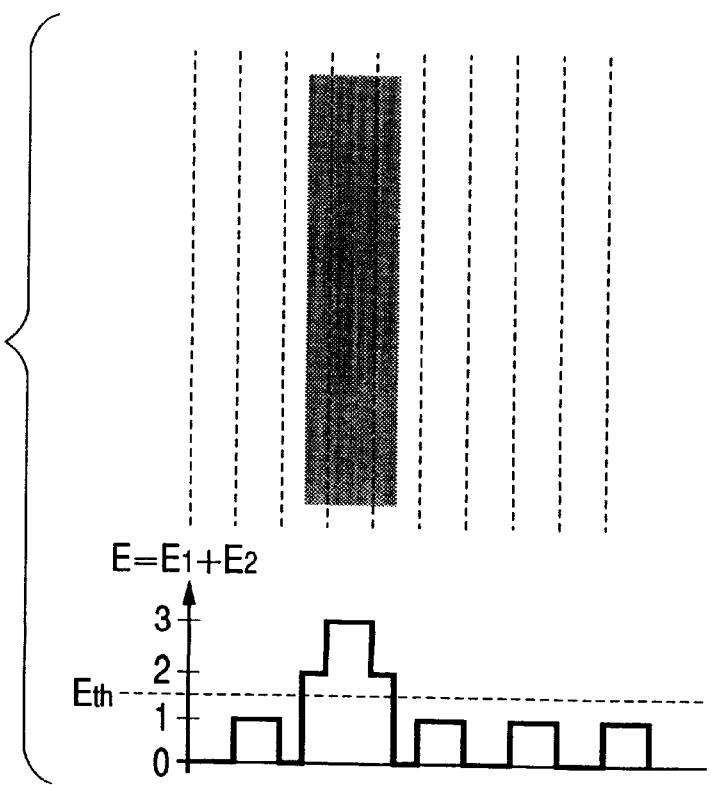

Supposing that after the periodic pattern exposure of FIG. 7 and without carrying out the development step, the normal projection exposure to form the exposure pattern of FIGS. 10A and 10B (projection exposure over the exposure threshold Eth (i.e., projection exposure at the exposure dose equal to double the threshold herein) in a linewidth that can be resolved with a high contrast, the linewidth being double that of the exposure pattern of FIG. 7) is carried out as superimposed in the same region or at the same exposure position of the same resist (while the center of the exposure pattern by the normal projection exposure is aligned with the center or the peak of the exposure pattern of the periodic pattern exposure whereby a good synthetic image or synthetic exposure pattern is obtained with good symmetry of the synthetic image or the synthetic exposure pattern obtained by superposition), the total exposure dose distribution of this resist becomes as illustrated in FIG. 10B, in which the exposure pattern of the two-beam interference exposure disappears and only the lithography pattern by the projection exposure is finally formed.

Figure 11A:
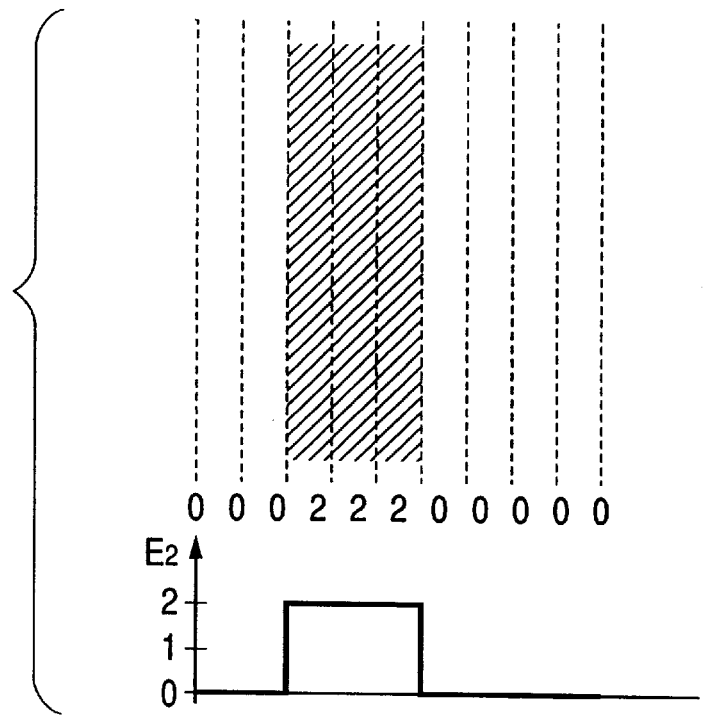
FIG. 11A and FIG. 11B are explanatory diagrams to show still another example of the exposure pattern (lithography pattern) which can be formed in the sixth embodiment.
Figure 11B:
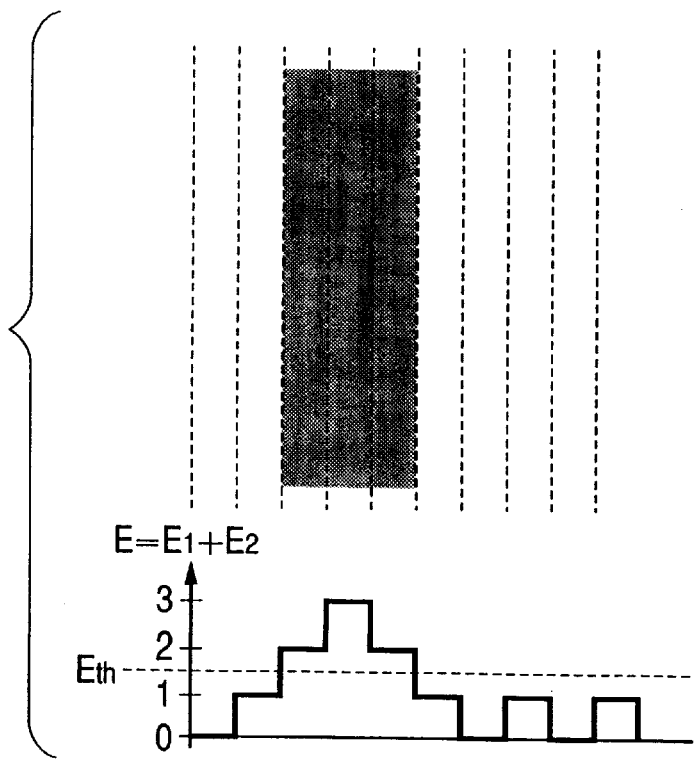

The same principle as in the case of FIGS. 10A and 10B is also applicable to the case of the exposure pattern as illustrated in FIGS. 11A and 11B in a linewidth that can be resolved with a high contrast, equal to three times that of the exposure pattern of FIG. 7, and to cases of exposure patterns in linewidths equal to four and more times. Therefore, in the double exposure method for carrying out the normal exposure with a mask having a plurality of patterns of different linewidths so as to create the exposure pattern of FIG. 7 and the exposure patterns of FIGS. 10A, 10B and FIGS. 11A, 11B, the linewidths of the lithography pattern finally obtained can be defined correctly, so that a variety of lithography patterns that can be implemented by the projection exposure can be formed by the double exposure method of the present embodiment.

By adjusting the exposure dose distributions (absolute values and distributions) of the periodic pattern exposure of the image with the high contrast and the normal exposure comprising the image with the low contrast and the threshold Eth of the resist of the photosensitive substrate as described above, the circuit pattern can be formed in combination of the various patterns as illustrated in FIG. 8, FIG.

9B, FIG. 10B, and FIG. 11B and in the minimum linewidth (resolution) equivalent to approximately that of the periodic pattern exposure (the pattern of FIG. 9B).

The principle of the double exposure method of the present embodiment is summarized below.

1. The exposure pattern by the periodic pattern where the normal exposure (projection exposure) is not effected and the maximum exposure dose is not more than the exposure threshold Eth of the resist, is not developed.

2. At exposure pattern areas (exposure positions) of the normal exposure carried out at the exposure dose not more than the exposure threshold Eth of the resist, the exposure pattern is formed in the resolution of the periodic pattern exposure determined by the combination of the exposure patterns of the normal exposure and periodic pattern exposure.

3. At exposure pattern areas of the normal exposure carried out at the exposure dose not less than the exposure threshold Eth of the resist, fine patterns that are not resolved by illumination only of the projection exposure are also formed similarly (corresponding to the mask).

A further advantage of the double exposure method of the present embodiment is that a far greater depth of focus than that by the exposure of the periodic pattern by the normal projection exposure can be obtained by carrying out the periodic pattern exposure necessitating the highest resolution by the two-beam interference exposure.

In the above description the order of the periodic pattern exposure and the normal exposure is one to carry out the periodic pattern exposure first, but the order may be reverse or they may be carried out simultaneously.

The present embodiment permits the fine and complex pattern, which was unable to be resolved before, to be formed by the double exposure method.

Namely, the present embodiment implements an exposure method of exposing a resist by images of patterns of a mask having a plurality of patterns images of which have respective contrasts different from each other, wherein an image forming position of a pattern an image of which has a low contrast, out of the patterns of the mask, is exposed by an image with a higher contrast than that of the image of the pattern with the low contrast, thereby enhancing a contrast of an exposure dose distribution concerning the pattern with the low contrast. In addition, the exposure method using the resist of the present invention may also be an exposure method of exposing a resist by an image of a pattern of a mask, using a certain radiation, wherein an image with a higher contrast than that of the image of the pattern is formed by a radiation having the same wavelength as the aforementioned radiation, and an image forming position of the pattern of the resist is exposed by this image with the higher contrast, thereby enhancing a contrast of an exposure dose distribution concerning the pattern of the resist, so that a finer pattern can be obtained. The exposure method using the resist of the present invention may also be an exposure method of exposing a resist by an image of a pattern of a mask, wherein an image with a higher contrast than that of the image of the pattern is formed without using the mask, and an image forming position of the pattern of the resist is exposed by this image with the higher contrast, thereby enhancing a contrast of an exposure dose distribution concerning the pattern of the resist, whereby the production cost of the mask can be decreased.

The exposure method using the resist of the present invention may also be an exposure method of carrying out double exposures at the same exposure wavelength by a periodic pattern exposure for carrying out exposure with a periodic pattern formed by interference of two beams or the like and a normal exposure for carrying out normal exposure with a mask having a pattern of a linewidth not more than a resolving power of an exposure apparatus used, so that the production process is simplified and the production cost is thus decreased.

EXAMPLES

The present invention will be described in further detail with examples thereof, but it should be noted that the present invention is by no means intended to be limited to these examples.

Example 1
(Synthesis of vinyl monomer)

A flask provided with a Dean-Stark trap cooling pipe was charged with xylene solution of vinyl acetate and 9-hydroxy-bicyclononane and the solution was kept at the boiling point in oil bath while being agitated. Boron trifluoride diethyl ether acetate was added into the solution and reaction was carried on while being refluxed before increase of water in the trap stopped. After completion of the reaction, the solution was cooled and water was added thereto, followed by extraction with ether. The extract was washed with saturated sodium chloride aqueous solution and thereafter dried by magnesium sulfate. Then the extract was purified by vacuum distillation, to obtain the following compound represented by Formula 16.

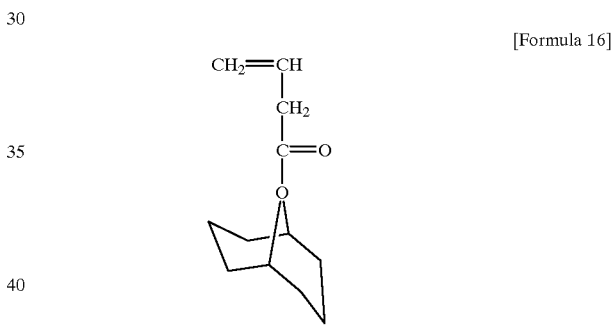

[Formula 16]

(Synthesis of copolymer of vinyl monomer and sulfur dioxide)

The vinyl monomer synthesized in Example 1 was copolymerized with sulfur dioxide by radical polymerization to obtain the photosensitive resin of the present invention. The copolymerization ratio of sulfur dioxide in the copolymer was in the range of 1% to 50% when calculated from elementary analysis, IR, NMR, and ESCA.

The number average molecular weight was fifty thousands to a million by GPC measurement (when reduced on the basis of polystyrene standard).

Example 2
(Preparation of Resist 1)

The copolyme r obtained in Example 1 was dissolved in propylene glycol monomethyl ether acetate, thereby preparing a solution containing the copolymer in the concentration of 5 wt %. Then the solution was filtered with a filter having the pore size of 0.1 $\mu$m, thereby obtaining Resist 1 of the p resent invention.

Example 3
(Synthesis of vinyl monomer)

A flask provided with a Dean-Stark trap cooling pipe was charged with xylene solution of vinyl acetate and the compound represented by Formula 17 and the solution was kept at the boiling point in oil bath while being agitated. Boron trifluoride diethyl ether acetate was added into the solution and reaction was carried on while being refluxed before increase of water in the trap stopped. After completion of the reaction, the solution was cooled and water was added thereto, followed by extraction with ether. The extract was washed with saturated sodium chloride aqueous solution and thereafter dried by magnesium sulfate. Then the extract was purified by vacuum distillation, to obtain the compound represented by Formula 18.

[Formula 17]

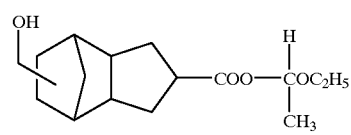

[Formula 18]

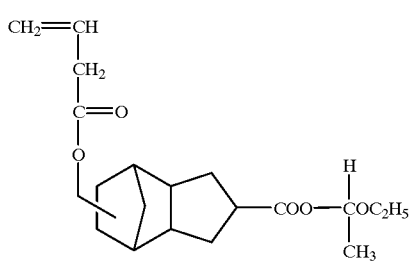

(Synthesis of copolymer of vinyl monomer and sulfur dioxide)

The vinyl monomer synthesized in Example 3 was copolymerized with sulfur dioxide by radical polymerization to obtain the photosensitive resin of the present invention. The copolymerization ratio of sulfur dioxide in the copolymer was in the range of 1% to 50% when calculated from elementary analysis, IR, NMR, and ESCA.

The number average molecular weight was fifty thousands to a million by GPC measurement (when reduced on the basis of polystyrene standard). In measurement by IR (the KBr method), two sharp peaks resulting from the sulfonyl group copolymerized with carbon were recognized in the band of 1100 to 1180 cm$^{-1}$ and in the band of 1300 to 1380 cm$^{-1}$, respectively.

Example 4
(Preparation of Resist 2)

The copolymer obtained in Example 3 was dissolved in propylene glycol monomethyl ether acetate, thereby preparing a solution containing the copolymer in the concentration of 5 wt %. Then the solution was filtered with the filter having the pore size of 0.1 µm, thereby obtaining Resist 2 of the present invention.

Example 5
(Preparation of Resist 3)

0.25 g of triphenyl sulfonium trifluoromethyl sulfonate as a photo-acid generator and 5 g of the polymer obtained in Example 3 were dissolved in 100 g of propylene glycol monomethyl ether acetate and the solution obtained was filtered with the filter of 0.1 µm, thereby obtaining Resist 3 of the present invention.

Example 6
(Preparation of Resist 4)

30 g of cresol novolak resin and 1.5 g of the polymer obtained in Example 3 were dissolved in 100 ml of propylene glycol monomethyl ether acetate and the solution obtained was filtered with the filter of 0.1 µm, thereby obtaining Resist 4 of the present invention.

Example 7
(Preparation of Resist 5)

0.08 g of triphenyl sulfonium trifluoromethyl sulfonate as a photo-acid generator, 30 g of polyvinyl phenol, and 1.5 g of the polymer obtained in Example 3 were dissolved in 100 ml of propylene glycol monomethyl ether acetate and the solution obtained was filtered with the filter of 0.1 µm, thereby obtaining Resist 5 of the present invention.

Example 8
(Preparation of Resist 6)

30 g of polyglutaraldehyde being a polymer having an alicyclic group, and 1.5 g of the polymer obtained in Example 3 were dissolved in 100 ml of propylene glycol monomethyl ether acetate and the solution obtained was filtered with the filter of 0.1 µm, thereby obtaining Resist 6 of the present invention.

Example 9
(Preparation of Resist 7)

0.08 g of triphenyl sulfonium trifluoromethyl sulfonate as a photo-acid generator, 30 g of ethylcellulose being a polymer having an alicyclic group, and 1.5 g of the photosensitive resin obtained in Example 3 were dissolved into a mixed solvent of 80 ml of propylene glycol monomethyl ether acetate and 20 ml of methyl isobutyl ketone and the solution obtained was filtered with the filter of 0.1 µm, thereby obtaining Resist 7 of the present invention.

Example 10
(Preparation of Resist 8)

0.08 g of triphenyl sulfonium trifluoromethyl sulfonate as a photo-acid generator, 30 g of polypara-hydroxy silsesquioxane being an alkali-soluble silicon-containing polymer, and 1.5 g of the polymer obtained in Example 3 were dissolved in a mixed solvent of 80 ml of propylene glycol monomethyl ether acetate and 20 ml of methyl isobutyl ketone and the solution obtained was filtered with the filter of 0.1 µm, thereby obtaining Resist 8 of the present invention.

Example 11
(Synthesis of resist for comparison)

A resist for comparison with the resists of the present invention was synthesized. Polymethyl isopropenyl ketone as photosensitive resin was dissolved in the concentration of 5 wt % in ethylcellosolve acetate as a solvent, and paramethoxybenzoic acid was dissolved therein by 0.05 wt % over ethylcellosolve. The solution obtained was filtered with the filter of 0.1 µm to obtain the comparative resist.

Example 12
(Formation of pattern 1)

Resist 3 was applied onto a silicon wafer by spin coating to form a film in the thickness of 1.0 µm on the silicon wafer. Then pattern writing was carried out on the film of Resist 3 with the exposure light of the g-line and the resist was developed with 2.38% tetramethyl ammonium hydroxide aqueous solution, thereby obtaining a pattern of 0.4 µm.

Example 13
(Formation of pattern 2)

Resist 3 was applied onto a silicon wafer by spin coating to form a film in the thickness of 1.0 µm on the silicon wafer.

Then pattern writing was carried out on the film of Resist 3 with the exposure light of the i-line and the resist was developed with 2.38% tetramethyl ammonium hydroxide aqueous solution, thereby obtaining a pattern of 0.28 µm.

Example 14
(Formation of pattern 3)
Each of Resists 1 to 8 and the comparative resist was applied onto a silicon wafer by spin coating to form a film in the thickness of 0.4 µm on the silicon wafer. Then, using an X-ray exposure apparatus, a tantalum pattern on a mask was transferred onto the resists through an X-ray mask and thereafter development was carried out using a developing device of a paddle type. Then each of the wafers was rinsed and dried by spin drying, thereby obtaining a pattern of 0.15 µm.

The developer herein was methyl isoamyl ketone for Resists 1 and 2 and 2.38% tetramethyl ammonium hydroxide aqueous solution for Resists 3 to 8 and the comparative resist.

Example 15
(Formation of pattern 4)
Each of Resists 1 to 8 and the comparative resist was applied onto a silicon wafer by spin coating to form a film in the thickness of 0.3 µm on the silicon wafer. Then pattern writing was carried out using an electron beam writing apparatus at the acceleration voltage of 10 kV and development was carried out using the developing device of the paddle type. Then each of the wafers was rinsed and dried by spin drying, thereby obtaining a pattern of 0.2 µm.

The developer herein was methyl isoamyl ketone for Resists 1 and 2 and 2.38% tetramethyl ammonium hydroxide aqueous solution for Resists 3 to 8 and the comparative resist.

Example 16
(Formation of pattern 5)
Each of Resists 1 to 8 and the comparative resist was applied onto a silicon wafer by spin coating to form a film in the thickness of 0.5 µm thereon. Then pattern writing was carried out with a proton beam and each resist was developed with isoamyl acetate, thereby obtaining a pattern of 0.15 µm at the exposure dose of $6 \times 10^{-6}$ C/cm$^2$.

Example 17
(Formation of pattern 6)
Each of Resists 1, 2, 3, 5, 6, 7, 8 and the comparative resist was applied onto a silicon wafer by spin coating to form a film in the thickness of 0.7 µm thereon. Then a pattern on a mask was transferred onto each resist by an exposure apparatus using the excimer laser of krypton fluoride as a light source and the resists were developed by the developing device of the paddle type. Then each wafer was rinsed and dried by spin drying, thereby obtaining a 0.2 µm pattern.

The developer herein was methyl isoamyl ketone for Resists 1 and 2 and 2.38% tetramethyl ammonium hydroxide aqueous solution for Resists 3 to 8 and the comparative resist.

Example 18
(Formation of pattern 7)
Each of Resists 1, 2, 3, 6, 7, 8 and the comparative resist was applied onto a silicon wafer by spin coating to form a film in the thickness of 0.7 µm thereon. Then a pattern on a mask was transferred onto each resist by an exposure apparatus using the excimer laser of argon fluoride as a light source and they were developed using the developing device of the paddle type. Then each wafer was rinsed and dried by spin drying, thereby obtaining a 0.18 µm pattern.

The developer herein was methyl isoamyl ketone for Resists 1 and 2 and 2.38% tetramethyl ammonium hydroxide aqueous solution for Resists 3, 6, 7, 8 and the comparative resist.

Example 19
(Formation of pattern with multilayered resist)
A resist containing principal components of novolak resin and naphthoquinone diazide was applied onto a silicon wafer by spin coating to form a film in the thickness of 1.0 µm thereon and thereafter hard-baked. Resist 8 was then applied onto the resist by spin coating to form a film in the thickness of 0.2 µm thereon. Then a pattern on a mask was transferred onto the resist by exposure apparatus using each of the X-ray, ion beam, electron beam, KrF excimer laser, and ArF excimer laser as a light source and development was carried out with 2.38% tetramethyl ammonium hydroxide aqueous solution, thereby obtaining a 0.2 µm pattern. Further, the novolak resist was processed by reactive ion etching using oxygen gas, whereby the 0.2 µm pattern formed in Resist 7 of the upper layer was transferred into the novolak resist of the lower layer.

The pattern shape of the multilayered resist of the present example had vertical side walls and was good.

Shape s of the patterns 1 to 7 described in Examples 12 to 18 were evaluated. The results are shown in Table 1.

Table 1 is a list of the evaluation results of the patterns formed by the exposure of Resists 1 to 8 of the present invention and the resist for comparison to the exposure beams. The mark "Δ" in Table 1 means that the pattern formed using the resist of the present invention is a good pattern as a pattern for the semiconductor devices and masks described previously.

The mark "○" in Table 1 means that the pattern formed using the resist of the present invention is a good pattern as a pattern for the semiconductor devices and masks described previously and is also a pattern that can be developed in short time.

The mark "⊙" in Table 1 means that the pattern formed using the resist of the present invention is a very good pattern as a pattern for the semiconductor devices and masks described previously and that the resist of the present invention has high dry-etch resistance.

The mark "×" in Table 1 means that a pattern can be obtained, but the dry-etch resistance is low and the resolution is also low.

As apparent from Table 1, the patterns formed using Resists 1 and 2 were at least good patterns when the exposure light was either of the X-ray, the ion beam, the electron beam, the KrF excimer laser, and the ArF excimer laser.

The pattern formed using Resist 3 was at least good and a pattern capable of being developed in short time, irrespective of the types of the exposure light beams.

The pattern formed using Resist 4 was a pattern at least capable of being developed extremely well when the exposure light was either of the X-ray, ion beam, and electron beam, and the resist of the present invention had high dry-etch resistance.

The pattern formed using Resist 5 was a pattern at least capable of being developed extremely well when the exposure light was either of the X-ray, ion beam, electron beam, and KrF excimer laser, and the resist of the present invention had high dry-etch resistance.

The patterns formed using Resists 6, 7, and 8 were patterns at least capable of being developed extremely well when the exposure light was either of the X-ray, ion beam, electron beam, KrF excimer laser, and ArF excimer laser, and the resists of the present invention had high dry-etch resistance.

The pattern formed using the resist for comparison had low dry-etch resistance and in turn low resolution, though the pattern was obtained, when the exposure light was either of the X-ray, ion beam, electron beam, KrF excimer laser, and ArF excimer laser.

Data for global alignment was read by an alignment unit and exposure was carried out successively at predetermined positions with driving the wafer stage based on the measurement result.

In step 18 (development) the wafer thus exposed was developed. In step 19 (etching) portions from which the resist was removed after the development were etched. In step 20 (stripping of resist) the resist was stripped off. These steps were carried out repetitively to form multiple circuit patterns on the wafer.

TABLE 1

| | Resists used | | | | | | | | |
|---|---|---|---|---|---|---|---|---|---|
| Exposure light | Resist 1 | Resist 2 | Resist 3 | Resist 4 | Resist 5 | Resist 6 | Resist 7 | Resist 8 | Resist for comparison |
| g-line | | | ○ | | | | | | |
| i-line | | | ○ | | | | | | |
| X-ray | ○ | ○ | ⊚ | ⊚ | ⊚ | ⊚ | ⊚ | ⊚ | x |
| electron beam | ○ | ○ | ⊚ | ⊚ | ⊚ | ⊚ | ⊚ | ⊚ | x |
| ion beam | ○ | ○ | ⊚ | ⊚ | ⊚ | ⊚ | ⊚ | ⊚ | x |
| KrF excimer laser | Δ | Δ | ⊚ | | ⊚ | ⊚ | ⊚ | ⊚ | x |
| ArF excimer laser | Δ | Δ | ⊚ | | | ⊚ | ⊚ | ⊚ | x |

Example 20

Described below is a method of producing a semiconductor device (semiconductor element) using the resist of the present invention.

FIG. 1 is a flowchart of production of IC in the present example. In the present example, step 1 (circuit design) was carried out to perform circuit design of IC. In step 2 (fabrication of mask) a mask was fabricated with a circuit pattern thus designed. On the other hand, a wafer of silicon or the like was prepared and in step 3 (wafer process) circuits were actually formed on the wafer by the lithography technology using the mask and wafer thus prepared.

In next step 4 (assembly), the wafer with the integrated circuits, fabricated in step 3, was processed into semiconductor chips and then assembly steps (dicing, bonding) were carried out, followed by packaging (chip encapsulation).

In step 5 (inspection) the IC chips fabricated in step 4 were inspected by an operation check test, a durability test, and so on.

Figure 2:
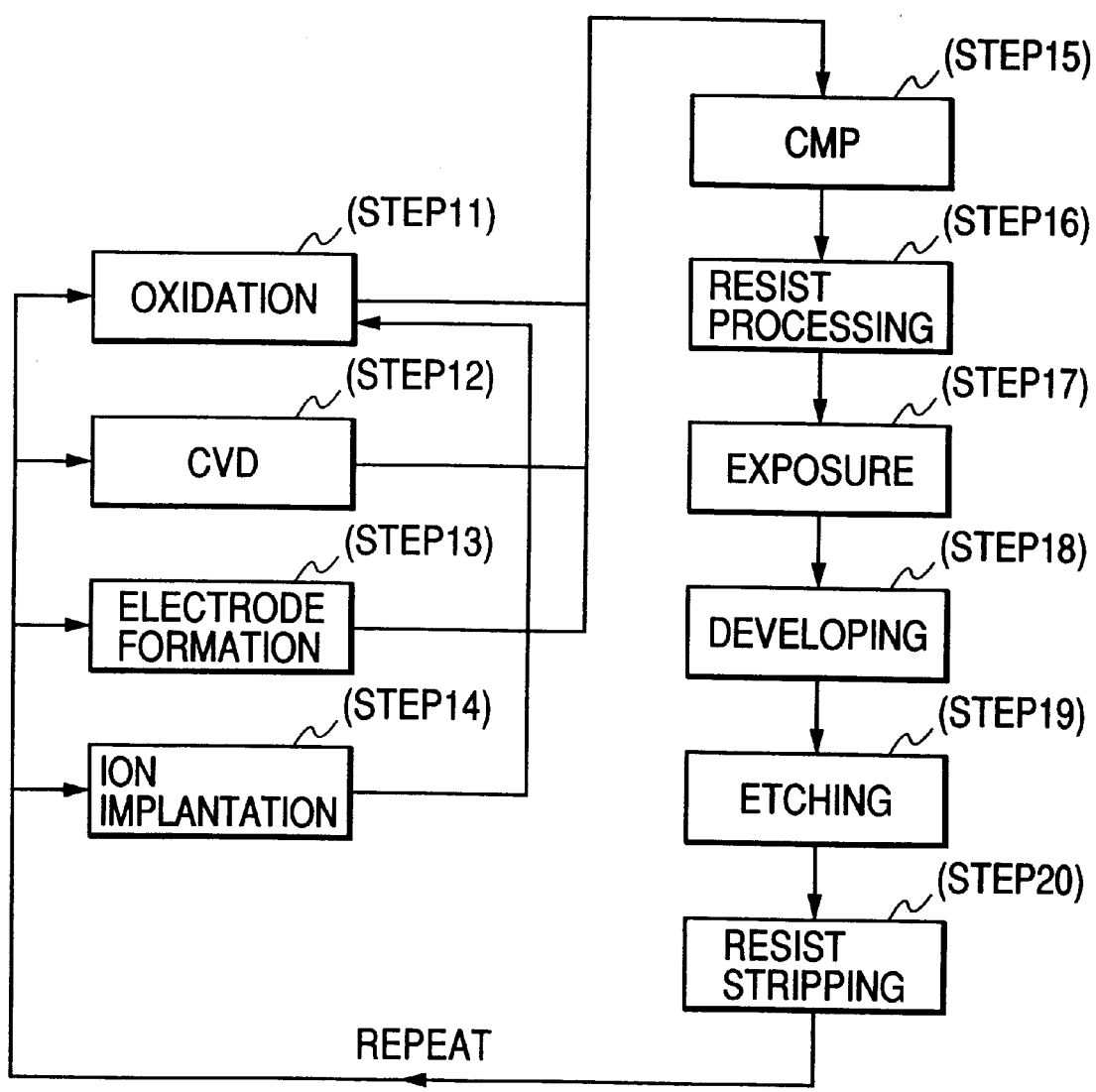
FIG. 2 is another flowchart of the method of producing the semiconductor device according to the present invention.

FIG. 2 is a detailed flowchart of the wafer process of step 3 described above in the fabrication of IC chips of the present example. First, the surface of the wafer was oxidized in step 11 (oxidation). Then an insulating film was formed in the surface of the wafer in step 12 (CVD).

In step 13 (formation of electrodes) electrodes were formed on the wafer by evaporation. In step 14 (ion implantation) ions were implanted into the wafer.

In step 15 (CMP) the wafer surface was polished into a flat surface by CMP (Chemical Mechanical Polishing) apparatus.

In step 16 (resist process), the wafer surface thus planarized was coated with the resist of the present invention. In step 17 (exposure) the circuit pattern of the mask was printed in the wafer by the exposure apparatus. First, a reticle was conveyed to be chucked by a reticle chuck and then the silicon wafer substrate coated with the resist of the present invention was loaded in the exposure apparatus.

Example 21

(Synthesis of vinyl monomer having adamantyl group in side chain)

As the synthesis method, the dehydration reaction similar to that described in Example 3 was employed. A flask provided with a Dean-Stark trap cooling pipe was charged with toluene solution of allylacetic acid and adamantanol, and boron trifluoride diethyl ether acetate was added into the solution. Then the solution was refluxed to synthesize a vinyl monomer having an adamantyl group in a side chain, of the present invention.

(Synthesis of copolymer of vinyl monomer having adamantyl group in side chain and sulfur dioxide)

The monomer synthesized in Example 21 was copolymerized with sulfur dioxide by radical polymerization, thereby obtaining a photosensitive resin of the present invention. The copolymerization ratio of sulfur dioxide contained in the copolymer was in the range of 1% to 50% when computed from elementary analysis, IR, NMR, and ESCA.

The number average molecular weight was fifty thousands to a million from GPC measurement (when reduced on the basis of polystyrene standard).

Example 22

(Preparation of Resist 9)

The copolymer obtained in Example 21 was dissolved in propylene glycol monomethyl ether acetate, thereby preparing a solution containing the copolymer in the concentration of 5 wt %. Then the solution was filtered with the filter having the pore size of 0.1 μm, thereby obtaining Resist 9 of the present invention.

Example 23

(Preparation of Resist 10)

0.25 g of triphenyl sulfonium hexafluoroantimonate as a photo-acid generator and 5 g of the polymer obtained in Example 21 were dissolved in 100 g of propylene glycol monomethyl ether acetate and the solution obtained was filtered with the filter of 0.1 μm, thereby obtaining Resist 10 of the present invention.

Example 24
(Preparation of Resist 11)
30 g of cresol novolak resin and 1.5 g of the polymer obtained in Example 21 were dissolved in 100 ml of propylene glycol monomethyl ether acetate and the solution obtained was filtered with the filter of 0.1 μm, thereby obtaining Resist 11 of the present invention.

Example 25
(Preparation of Resist 12)
0.08 g of triphenyl sulfonium hexafluoroantimonate as a photo-acid generator, 30 g of polyvinyl phenol, and 1.5 g of the polymer obtained in Example 21 were dissolved in 100 ml of propylene glycol monomethyl ether acetate and the solution obtained was filtered with the filter of 0.1 μm, thereby obtaining Resist 12 of the present invention.

Example 26
(Preparation of Resist 13)
30 g of polyglutaraldehyde being a polymer having an alicyclic group, and 1.5 g of the polymer obtained in Example 21 were dissolved in 100 ml of propylene glycol monomethyl ether acetate and the solution obtained was filtered with the filter of 0.1 μm, thereby obtaining Resist 13 of the present invention.

Example 27
(Preparation of Resist 14)
0.08 g of triphenyl sulfonium hexafluoroantimonate as a photo-acid generator, 30 g of ethylcellulose being a polymer having an alicyclic group, and 1.5 g of the photosensitive resin obtained in Example 21 were dissolved into a mixed solvent of 80 ml of propylene glycol monomethyl ether acetate and 20 ml of methyl isobutyl ketone and the solution obtained was filtered with the filter of 0.1 μm, thereby obtaining Resist 14 of the present invention.

Example 28
(Preparation of Resist 15)
0.08 g of triphenyl sulfonium hexafluoroantimonate as a photo-acid generator, 30 g of polypara-hydroxy silsesquioxane being an alkali-soluble silicon-containing polymer, and 1.5 g of the polymer obtained in Example 21 were dissolved in a mixed solvent of 80 ml of propylene glycol monomethyl ether acetate and 20 ml of methyl isobutyl ketone and the solution obtained was filtered with the filter of 0.1 μm, thereby obtaining Resist 15 of the present invention.

Example 29
(Synthesis of resist for comparison)
A resist for comparison with the resists of the present invention was synthesized. Polymethyl isopropenyl ketone as photosensitive resin was dissolved in the concentration of 5 wt % in ethylcellosolve as a solvent, and para-methoxybenzoic acid was dissolved therein by 0.05 wt % over ethylcellosolve. The solution obtained was filtered with the filter of 0.1 μm to obtain Comparative Resist 2.

Example 30
Formation of Pattern 8
Resist 10 was applied onto a silicon wafer by spin coating to form a film in the thickness of 1.0 μm on the silicon wafer. Then pattern writing was carried out on the film of Resist 10 with the exposure light of the g-line and the resist was developed with tetramethyl ammonium hydroxide aqueous solution, thereby obtaining a pattern of 0.4 μm.

Example 31
Formation of Pattern 9
Resist 10 was applied onto a silicon wafer by spin coating to form a film in the thickness of 1.0 μm on the silicon wafer. Then pattern writing was carried out on the film of Resist 10 with the exposure light of the i-line and the resist was developed with tetramethyl ammonium hydroxide aqueous solution, thereby obtaining a pattern of 0.28 μm.

Example 32
Formation of Pattern 10
Each of Resists 9 to 15 and Comparative Resist 2 was applied onto a silicon wafer by spin coating to form a film in the thickness of 0.4 μm on the silicon wafer. Then, using the X-ray exposure apparatus, a tantalum pattern on a mask was transferred onto each resist through an X-ray mask and thereafter development was carried out with 2.38% tetramethyl ammonium hydroxide aqueous solution, thereby obtaining a pattern of 0.15 μm.

Example 33
Formation of Pattern 11
Each of Resists 9 to 15 and Comparative Resist 2 was applied onto a silicon wafer by spin coating to form a film in the thickness of 0.3 μm on the silicon wafer. Then pattern writing was effected at the acceleration voltage of 10 kV using the electron beam writing apparatus and then development was carried out with isoamyl acetate, thereby obtaining a pattern of 0.2 μm.

Example 34
Formation of Pattern 12
Each of Resists 9 to 15 and Comparative Resist 2 was applied onto a silicon wafer by spin coating to form a film in the thickness of 0.5 μm thereon. Then pattern writing was carried out with a proton beam and each resist was developed with isoamyl acetate, thereby obtaining a pattern of 0.15 μm at the exposure dose of $6 \times 10^{-8}$ C/cm$^2$.

Example 35
Formation of Pattern 13
Each of Resists 9, 10, 12, 13, 14, 15 and Comparative Resist 2 was applied onto a silicon wafer by spin coating to form a film in the thickness of 0.7 μm thereon. Then a pattern on a mask was transferred onto each resist by the exposure apparatus using the excimer laser of krypton fluoride as a light source and development was carried out with 2.38% tetramethyl ammonium hydroxide aqueous solution, thereby obtaining a pattern of 0.2 μm.

Example 36
Formation of Pattern 14
Each of Resists 9, 10, 13, 14, 15 and Comparative Resist 2 was applied onto a silicon wafer by spin coating to form a film in the thickness of 0.7 μm thereon. Then a pattern on a mask was transferred onto each resist by the exposure apparatus using the excimer laser of argon fluoride as a light source and development was carried out with 2.38% tetramethyl ammonium hydroxide aqueous solution, thus obtaining a pattern of 0.18 μm.

Example 37

Formation of Pattern with Multilayered Resist

A resist containing principal components of novolak resin and naphthoquinone diazide was applied onto a silicon wafer by spin coating to form a film in the thickness of 1.0 μm thereon and thereafter hard-baked. Resist 15 was then applied onto the resist by spin coating to form a film in the thickness of 0.2 μm thereon. Then a pattern on a mask was transferred onto the resist by the exposure apparatus using each of X-ray, ion beam, electron beam, KrF excimer laser, and ArF excimer laser as a light source and development was carried out with 2.38% tetramethyl ammonium hydroxide aqueous solution, thereby obtaining a 0.2 μm pattern. Further, the novolak resist was processed by reactive ion etching using oxygen gas, whereby the 0.2 μm pattern formed in the resist of the upper layer was transferred into the novolak resist of the lower layer.

beam, and the resist of the present invention had high dry-etch resistance.

The pattern formed using Resist 12 was a pattern at least capable of being developed extremely well when the exposure light was either of the X-ray, ion beam, electron beam, and KrF excimer laser, and the resist of the present invention had high dry-etch resistance.

The patterns formed using Resists 13, 14, and 15 were patterns at least capable of being developed extremely well when the exposure light was either of the X-ray, ion beam, electron beam, KrF excimer laser, and ArF excimer laser, and the resists of the present invention had high dry-etch resistance.

The pattern formed using Comparative Resist 2 had low dry-etch resistance and in turn low resolution, though the pattern was obtained, when the exposure light was either of the X-ray, ion beam, electron beam, KrF excimer laser, and ArF excimer laser.

TABLE 2

| Exposure light | Resists used | | | | | | | |
| --- | --- | --- | --- | --- | --- | --- | --- | --- |
| | Resist 9 | Resist 10 | Resist 11 | Resist 12 | Resist 13 | Resist 14 | Resist 15 | Resist for comparison 2 |
| g-line | | ○ | | | | | | |
| i-line | | ○ | | | | | | |
| X-ray | ○ | ⊚ | ⊚ | ⊚ | ⊚ | ⊚ | ⊚ | x |
| electron beam | ○ | ⊚ | ⊚ | ⊚ | ⊚ | ⊚ | ⊚ | x |
| ion beam | ○ | ⊚ | ⊚ | ⊚ | ⊚ | ⊚ | ⊚ | x |
| KrF excimer laser | Δ | ⊚ | | ⊚ | ⊚ | ⊚ | ⊚ | x |
| ArF excimer laser | Δ | ⊚ | | | ⊚ | ⊚ | ⊚ | x |

The pattern forming capability was evaluated with the patterns 9 to 15 described in Examples 30 to 37 and the pattern of the multilayer resist. The results are shown in Table 2.

Table 2 is a list of the evaluation results of the patterns formed by the exposure of Resists 9 to 15 of the present invention to the exposure beams. The mark "Δ" in Table 2 means that the pattern formed using the resist of the present invention is a good pattern as a pattern for the semiconductor devices and masks described previously.

The mark "○" in Table 2 means that the pattern formed using the resist of the present invention is a good pattern as a pattern for the semiconductor devices and masks described previously and a pattern that can be developed in short time.

The mark "⊚" in Table 2 means that the pattern formed using the resist of the present invention is a very good pattern as a pattern for the semiconductor devices and masks described previously and that the resist of the present invention has high dry-etch resistance.

The mark "x" in Table 2 means that a pattern can be obtained, but the dry-etch resistance is low and the resolution is low.

As apparent from Table 2, the pattern formed using Resist 9 was at least a good pattern when the exposure light was either of the X-ray, the ion beam, the electron beam, the KrF excimer laser, and the ArF excimer laser.

The pattern formed using Resist 10 was at least good and a pattern capable of being developed in short time, irrespective of the types of the exposure light beams.

The pattern formed using Resist 11 was a pattern at least capable of being developed extremely well when the exposure light was either of the X-ray, ion beam, and electron

Example 38

Described below is a method of producing a semiconductor device (semiconductor element) using the resist of the present invention.

FIG. 1 is a flowchart of production of IC in the present example. In the present example, step 1 (circuit design) was carried out to perform circuit design of IC. In step 2 (fabrication of mask) a mask was fabricated with a circuit pattern thus designed. On the other hand, a wafer of silicon or the like was prepared and in step 3 (wafer process) circuits were actually formed on the wafer by the lithography technology using the mask and wafer thus prepared.

In next step 4 (assembly), the wafer with the integrated circuits, fabricated in step 3, was processed into semiconductor chips and then assembly steps (dicing, bonding) were carried out, followed by packaging (chip encapsulation).

In step 5 (inspection) the IC chips fabricated in step 4 were inspected by an operation check test, a durability test, and so on.

FIG. 2 is a detailed flowchart of the wafer process of step 3 described above in the fabrication of IC chips of the present example. First, the surface of the wafer was oxidized in step 11 (oxidation). Then an insulating film was formed in the surface of the wafer in step 12 (CVD).

In step 13 (formation of electrodes) electrodes were formed on the wafer by evaporation. In step 14 (ion implantation) ions were implanted into the wafer. In step 15 (CMP) the wafer surface was polished into a flat surface by CMP (Chemical Mechanical Polishing) apparatus, and the wafer surface thus planarized was coated with the resist of the present invention.

In step 16 (exposure) the circuit pattern of the mask was printed in the wafer by the exposure apparatus. First, a reticle was conveyed to be chucked by a reticle chuck and then the silicon wafer substrate coated with the resist of the present invention was loaded in the exposure apparatus. Data for global alignment was read by an alignment unit and exposure was carried out successively at predetermined positions with driving the wafer stage based on the measurement result.

In step 17 (development) the wafer thus exposed was developed. In step 18 (etching) portions from which the resist was removed after the development were etched. These steps were carried out repetitively to form multiple circuit patterns on the wafer.

According to the present invention, the photosensitive resin of the present invention is composed of the vinyl monomer moiety and the sulfonyl moiety and the bonds are cleaved between the vinyl monomer moiety and the sulfonyl moiety during exposure, thereby enhancing the solubility in the alkali solution. Therefore, the resist prepared using the copolymer of the present invention has the high sensitivity to the exposure light and can form the pattern with high accuracy.

When the resist of the present invention is used, the pattern can be developed in short time. As a consequence, the time can be decreased for formation of the semiconductor devices and masks having fine patterns.

What is claimed is:

1. A photosensitive resin comprising a vinyl monomer moiety having an alicyclic group in a side chain thereof, and a sulfonyl moiety, wherein said vinyl monomer moiety forms a main chain and wherein a carbon of the vinyl monomer moiety is bound to the sulfonyl moiety and bound to a methylene chain.

2. The photosensitive resin according to claim 1, wherein said vinyl monomer moiety forms a main chain and wherein a carbon of the vinyl monomer moiety is bound to the sulfonyl moiety, and bound to a methylene chain.

3. The photosensitive resin according to claim 1, which has the structure represented by the formula:

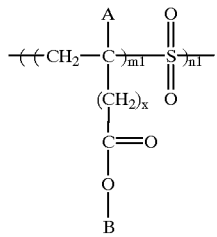

[Formula 1]

wherein x is an integer of either of 1 to 6, A is either one of hydrogen (H), methyl ($CH_3$), and a halogen, B is the alicyclic group, and m1 and n1 are integers.

4. The photosensitive resin according to claim 1, which has the structure represented by the formula:

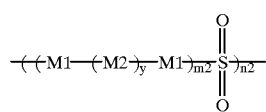

[Formula 3]

wherein M1 is a structural unit represented by the following formula, and y, m2, and n2 are integers;

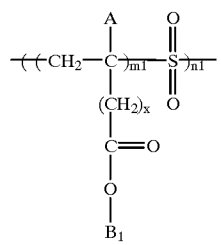

[Formula 4]

wherein x is an integer of either of 1 to 6, A is either one of hydrogen (H), methyl ($CH_3$), and a halogen, $B_1$ is a functional group, and m1 and n1 are integers; and wherein M2 is a structural unit represented by the formula:

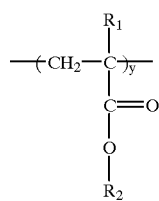

[Formula 5]

wherein $R_1$ represents either hydrogen (H), methyl ($CH_3$), or a halogen, $R_2$ represents hydrogen (H) or an alkyl group, and y is an integer.

5. A resist composition comprising a component of the photosensitive resin as set forth in either one of claims 1, 3 or 4, and a solvent for dissolving the photosensitive resin component.

6. A resist composition comprising a component of the photosensitive resin as set forth in either one of claims 1, 3 or 4, a compound which generates an acid under irradiation of an electromagnetic wave or a charged particle beam, and a solvent for dissolving the photosensitive resin component and the acid-generating compound.

7. A resist composition comprising at least one of the photosensitive resins as set forth in claims 1, 3 or 4, an alkali-soluble resin, and a solvent for dissolving the photosensitive resin component and the alkali-soluble resin.

8. The resist composition according to claim 7, wherein the alkali-soluble resin is a silicon-containing polymer.

9. A method of producing a semiconductor device, comprising the step of coating a substrate with a resist comprising a photosensitive resin, the photosensitive resin comprising a vinyl monomer moiety having an alicyclic group in a side chain thereof, and a sulfonyl moiety, and the step of exposing the resist coated on the substrate to form a pattern.

10. A method of producing a mask for exposure, comprising the step of coating a substrate with a resist comprising a photosensitive resin, the photosensitive resin comprising a vinyl monomer moiety having an alicyclic group in a side chain thereof, and a sulfonyl moiety, and the step of exposing the resist coated on the substrate to form a pattern.

11. A semiconductor device having a pattern formed with a resist comprising a photosensitive resin, the photosensitive resin comprising a vinyl monomer moiety having an alicyclic group in a side chain thereof, and a sulfonyl moiety.

12. A mask for exposure having a pattern formed with a resist comprising a photosensitive resin, the photosensitive resin comprising a vinyl monomer moiety having an alicyclic group in a side chain thereof, and a sulfonyl moiety.

13. A photosensitive resin comprising a vinyl monomer moiety having an adamantyl group in a side chain thereof, and a sulfonyl moiety.

14. The photosensitive resin according to claim 13, wherein said vinyl monomer moiety forms a main chain and wherein a carbon of the vinyl monomer moiety is bound to the sulfonyl moiety and bound to a methylene chain.

15. The photosensitive resin according to claim 13, which has the structure represented by the formula:

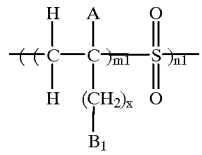
[Formula 19]

wherein X is an integer of either of 1 to 6, A is either one of H, $CH_3$, and a halogen, m1 and n1 are integers, and $B_1$ is a functional group expressed by the formula;

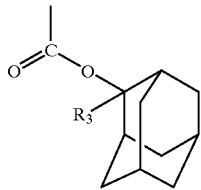
[Formula 20]

wherein $R_3$ is either an alkyl group having 1 to 3 carbon atoms, or hydrogen.

16. The photosensitive resin according to claim 13, which has the structure represented by the formula:

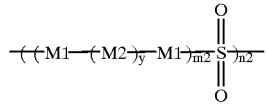
[Formula 21]

where M1 is a structural unit represented by the following formula, and y, m2, and n2 are integers;

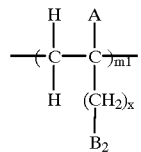
[Formula 22]

wherein X is an integer of either of 1 to 6, A is either one of H, $CH_3$ and a halogen element, m1 is an integer, and $B_2$ is a functional group expressed by the formula:

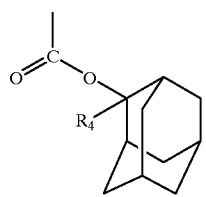
[Formula 23]

wherein R4 is either an alkyl group having 1 to 3 carbon atoms, or hydrogen;
and wherein M2 is a structural unit represented by the following formula:

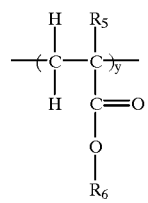
[Formula 24]

wherein $R_5$ represents either one of hydrogen (H), methyl ($CH_3$) and a halogen, $R_6$ represents hydrogen (H) or an alkyl group, and y is an integer.

17. A resist having dissolved therein a photosensitive resin comprising a vinyl monomer moiety having an adamantyl group in a side chain thereof, and a sulfonyl moiety.

18. The resist according to claim 17, comprising an acid generator for generating an acid when optically excited.

19. The resist according to claim 17, comprising an alkali-soluble resin.

20. The resist according to claim 17, comprising a silicon-based polymer.

21. A method of producing a semiconductor device, the method comprising the step of coating a substrate with a resist comprising a photosensitive resin, the photosensitive resin comprising a vinyl monomer moiety having an adamantyl group in a side chain thereof, and a sulfonyl moiety, and the step of exposing the resist coated on the substrate to form a pattern.

22. A method of producing a mask for exposure, the method comprising the step of coating a substrate with a resist comprising a photosensitive resin, the photosensitive resin comprising a vinyl monomer moiety having an adamantyl group in a side chain thereof, and a sulfonyl moiety, and the step of exposing the resist coated on the substrate to form a pattern.

23. A semiconductor device having a pattern formed with a resist comprising a photosensitive resin, the photosensitive resin comprising a vinyl monomer moiety having an adamantyl group in a side chain thereof, and a sulfonyl moiety.

24. A mask for exposure having a pattern formed with a resist comprising a photosensitive resin, the photosensitive resin comprising a vinyl monomer moiety having an adamantyl group in a side chain thereof, and a sulfonyl moiety.

25. An exposure method comprising exposing a resist by images of patterns of a mask having a plurality of patterns whose images have mutually different contrasts, using the resist comprising the photosensitive resin as set forth in either claim 1 or 13, wherein an image forming position of a pattern with a low contrast out of the images of the patterns of the mask is exposed by an image with a higher contrast than that of the image of the pattern with the low contrast, thereby enhancing a contrast of an exposure dose distribution concerning the pattern with the low contrast.

26. An exposure method comprising exposing a resist by an image of a pattern of a mask with a radiation, using the resist comprising the photosensitive resin as set forth in either claim 1 or 13, wherein an image with a higher contrast than that of the image of the pattern is formed with a radiation having the same wavelength as that of the aforementioned radiation and an image forming position of the pattern of the resist is exposed by the image with the higher contrast, thereby enhancing a contrast of an exposure dose distribution concerning the pattern of the resist.

27. An exposure method comprising exposing a resist by an image of a pattern of a mask, using the resist comprising the photosensitive resin as set forth in either claim 1 or 13, wherein an image with a higher contrast than that of the image of the pattern is formed without using the mask and an image forming position of the pattern of the resist is exposed by the image with the higher contrast, thereby enhancing a contrast of an exposure dose distribution concerning the pattern of the resist.

28. An exposure method comprising exposing a resist, using the resist comprising the photosensitive resin as set forth in either claim 1 or 13, wherein double exposures are carried out at a single exposure wavelength by a periodic pattern exposure for carrying out exposure by a periodic pattern formed by interference of two beams or the like and a normal exposure for carrying out normal exposure using a mask having a pattern of a linewidth not more than a resolving power of an exposure apparatus used.

* * * * *

UNITED STATES PATENT AND TRADEMARK OFFICE
CERTIFICATE OF CORRECTION

PATENT NO.  : 6,225,019 B1
DATED       : May 1, 2001
INVENTOR(S) : Minoru Matsuda et al.

It is certified that error appears in the above-identified patent and that said Letters Patent is hereby corrected as shown below:

Column 6,
Line 43, "can not" should read -- cannot --.

Column 11,
Line 10, "x-rays" should read -- X-rays --; and
Line 46, "can not" should read -- cannot --.

Column 20,
Line 61, "p" should be deleted; and
Line 62, "resent" should read -- present --.

Column 21,
Line 9, "distillation ," should read -- distillation, --.

Column 24,
Line 26, "Shape s" should read -- Shapes --.

Column 31,
Lines 34-37, claim 2 should be deleted.

Signed and Sealed this

Seventh Day of May, 2002

Attest:

Attesting Officer

JAMES E. ROGAN
*Director of the United States Patent and Trademark Office*